US008054045B2

(12) United States Patent
Kawahara et al.

(10) Patent No.: US 8,054,045 B2
(45) Date of Patent: Nov. 8, 2011

(54) STATUS DETECTOR FOR POWER SUPPLY, POWER SUPPLY, AND INITIAL CHARACTERISTIC EXTRACTING DEVICE FOR USE WITH POWER SUPPLY

(75) Inventors: Youhei Kawahara, Hitachi (JP); Akihiko Emori, Hitachi (JP); Shuko Yamauchi, Hitachi (JP); Hirotaka Takahashi, Hitachi (JP); Masami Shida, Mito (JP); Akihiko Kudo, Hitachinaka (JP)

(73) Assignee: Hitachi Vehicle Energy, Ltd., Hitachinaka-shi (JP)

( * ) Notice: Subject to any disclaimer, the term of this patent is extended or adjusted under 35 U.S.C. 154(b) by 0 days.

(21) Appl. No.: 12/577,907

(22) Filed: Oct. 13, 2009

(65) Prior Publication Data
US 2010/0030499 A1 Feb. 4, 2010

Related U.S. Application Data

(63) Continuation of application No. 11/347,388, filed on Feb. 6, 2006, now Pat. No. 7,622,894.

(30) Foreign Application Priority Data

Mar. 7, 2005 (JP) .................................. 2005-062073

(51) Int. Cl.
*H02J 7/00* (2006.01)
(52) U.S. Cl. ......... 320/127; 320/132; 324/430; 324/432
(58) Field of Classification Search .................. 320/127, 320/137, 165, 132; 324/434, 430, 431, 432, 324/552
See application file for complete search history.

(56) References Cited

U.S. PATENT DOCUMENTS

| 4,800,336 | A | | 1/1989 | Mikami et al. |
| 5,193,067 | A | | 3/1993 | Sato et al. |
| 5,572,110 | A | | 11/1996 | Dunstan |
| 5,578,915 | A | * | 11/1996 | Crouch et al. ................ 324/428 |
| 5,640,078 | A | | 6/1997 | Kou et al. |
| 5,691,621 | A | | 11/1997 | Phuoc et al. |
| 5,804,894 | A | | 9/1998 | Leeson et al. |
| 5,889,386 | A | | 3/1999 | Koenck |

(Continued)

FOREIGN PATENT DOCUMENTS

CN 1674401 A 9/2005

(Continued)

OTHER PUBLICATIONS

Japanese office action dated Sep. 14, 2010.

*Primary Examiner* — Arun Williams
(74) *Attorney, Agent, or Firm* — Crowell & Moring LLP

(57) ABSTRACT

In a status detector for a power supply, a power supply, and an initial characteristic extracting device for use with the power supply, a measuring unit obtains measured values of at least current, voltage and temperature of the electricity accumulating unit. A processing unit executes status detection of the electricity accumulating unit by using the measured values and the characteristic information of the electricity accumulating unit which is stored in a memory unit. A discrepancy detecting unit detects the presence of a discrepancy away from a theoretical value when a result of the status detection is changed over a predetermined threshold or reversed with respect to the measured values. A modifying unit modifies the characteristic information depending on the detected discrepancy.

8 Claims, 18 Drawing Sheets

U.S. PATENT DOCUMENTS

| | | | |
|---|---|---|---|
| 6,067,845 A | 5/2000 | Meerpohl et al. | |
| 6,081,154 A | 6/2000 | Ezell et al. | |
| 6,091,246 A | 7/2000 | Saigo et al. | |
| 6,198,253 B1 * | 3/2001 | Kurle et al. | 320/132 |
| 6,246,890 B1 | 6/2001 | Sato et al. | |
| 6,252,375 B1 | 6/2001 | Richter | |
| 6,621,250 B1 * | 9/2003 | Ohkubo et al. | 320/136 |
| 6,653,820 B1 | 11/2003 | Smith | |
| 6,832,171 B2 * | 12/2004 | Barsoukov et al. | 702/65 |
| 6,961,592 B2 | 11/2005 | O'Connor | |
| 7,171,186 B2 | 1/2007 | Miyachi et al. | |
| 7,173,397 B2 | 2/2007 | Kinoshita et al. | |
| 7,525,285 B2 * | 4/2009 | Plett | 320/132 |
| 2002/0011822 A1 | 1/2002 | Sakai et al. | |
| 2002/0070708 A1 | 6/2002 | Wu | |
| 2003/0097225 A1 * | 5/2003 | Teruo | 702/63 |
| 2003/0141847 A1 | 7/2003 | Fujiwara | |
| 2004/0027093 A1 | 2/2004 | Tashiro et al. | |

FOREIGN PATENT DOCUMENTS

| | | |
|---|---|---|
| JP | 10-289734 | 10/1998 |
| JP | 11-218567 | 8/1999 |
| JP | 2000-166105 | 6/2000 |
| JP | 2000-166109 | 6/2000 |
| JP | 2001-085071 | 3/2001 |
| JP | 2002-189066 A | 7/2002 |
| JP | 2003-35755 A | 2/2003 |
| JP | 2003-303627 A | 10/2003 |

* cited by examiner

FIG. 3
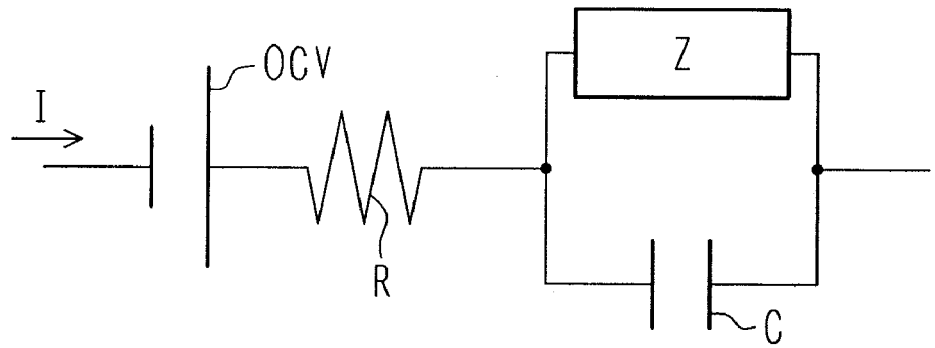
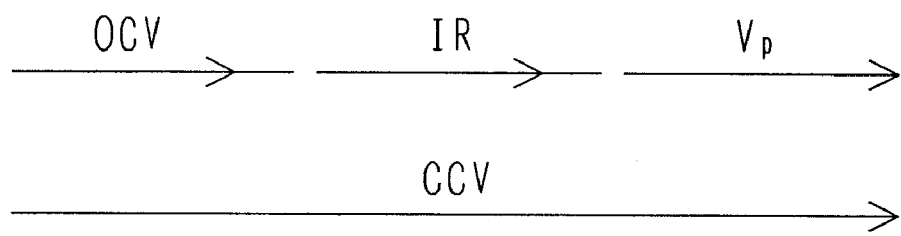
FIG. 4
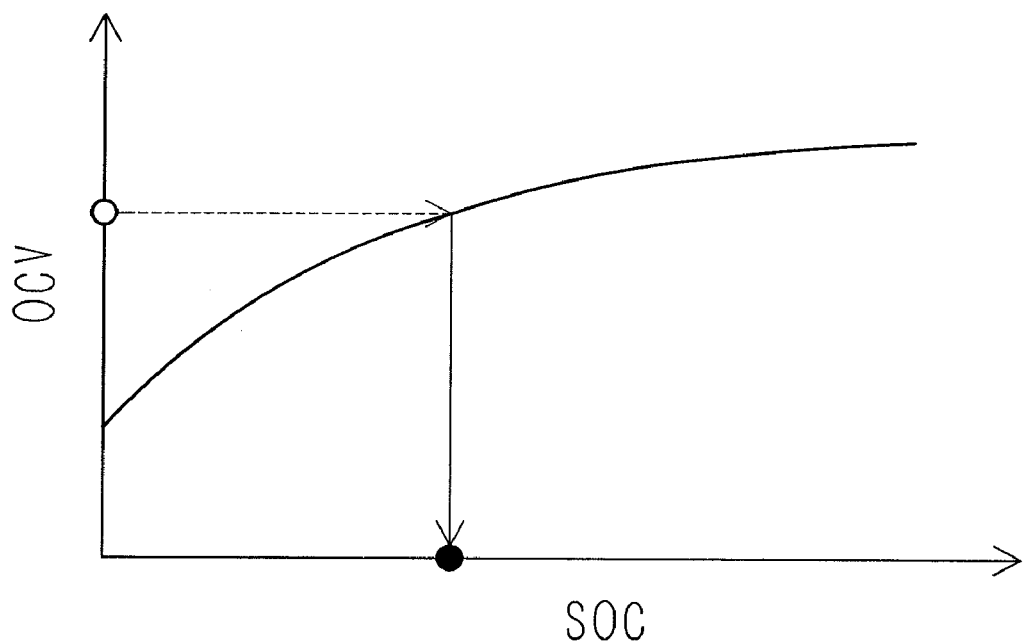

STATUS DETECTOR FOR POWER SUPPLY, POWER SUPPLY, AND INITIAL CHARACTERISTIC EXTRACTING DEVICE FOR USE WITH POWER SUPPLY

CROSS REFERENCE TO RELATED APPLICATION

This application is a continuing application of U.S. application Ser. No. 11/347,388, filed Feb. 6, 2009 now U.S. Pat. No. 7,622,894, which claims priority under 35 U.S.C. §119 to Japanese Patent Application No. 2005-062073, filed Mar. 7, 2005, the entire disclosure of which are herein expressly incorporated by reference.

BACKGROUND OF THE INVENTION

1. Field of the Invention

The present invention relates to a status detector for a power supply, a power supply, and an initial characteristic extracting device for use with the power supply, each of which is suitable for detecting the status of a battery (accumulator).

2. Description of the Related Art

In power supplies, decentralized power storages, and electric vehicles using electricity accumulating units such as a lithium secondary battery, a nickel-hydrogen battery, a lead-acid battery, and an electric double-layer capacitor, a status detector for detecting the status of each electricity accumulating unit is employed to ensure safe and effective use of the electricity accumulating unit. The status of the electricity accumulating unit includes, e.g., the state of charge (SOC) or the remaining capacity indicating to what extent the unit is charged or how much dischargeable charges remain, and the state of health (SOH) or a deterioration level indicating how far the unit is deteriorated or run down. In order to detect those states of the electricity accumulating unit, it is also required to know characteristic information (such as internal DC resistance) of the electricity accumulating unit beforehand.

SOC (State Of Charge) of a power supply used in portable equipment, electric vehicles, etc. can be detected by integrating current discharged from the fully charged state and calculating a ratio of the amount of charges remaining in the electricity accumulating unit (i.e., the remaining capacity) to the amount of maximally chargeable charges (i.e., the fully charged capacity). In many of the electricity accumulating units, however, because the fully charged capacity is changed depending on SOH (State Of Health), temperature, etc., it is difficult to accurately detect SOC, taking into account those changes depending on time and environment as well.

To overcome such a difficulty, there are known techniques as follows. For example, JP-A-10-289734 (Patent Document 1) discloses that an initial battery characteristic is modified in accordance with a temperature modification coefficient computed based on a battery temperature and a deterioration modification coefficient computed based on a battery deterioration, and the remaining capacity of a battery is computed based on not only the modified battery characteristic, but also a discharge current and a terminal voltage during discharge.

Also, JP-A-11-218567 (Patent Document 2) discloses that a deteriorated battery characteristic is computed by modifying an initial battery characteristic based on respective relations to a temperature modification coefficient, an internal resistance deterioration modification coefficient, and a capacity deterioration modification coefficient.

JP-A-2000-166105 (Patent Document 3) discloses that the state of charge is detected based on a charge or discharge current, the state of accumulated electricity is detected based on a voltage, and the state of charge is controlled in accordance with the detected results.

JP-A-2000-166109 (Patent Document 4) discloses that an electromotive voltage is determined from a charge or discharge current and a voltage, and a charge characteristic is computed based on the relationship between the electromotive voltage and the charge characteristic.

Further, JP-A-2001-85071 (Patent Document 5) discloses that a temperature of each of combined battery modules is estimated based on a voltage between respective two terminals and a current flowing through each terminal.

SUMMARY OF THE INVENTION

However, the following problems are still left with the related art. According to the method disclosed in JP-A-10-289734, influences of temperature and deterioration are taken into consideration as the temperature modification coefficient and the deterioration modification coefficient, and parameters necessary for calculating the remaining capacity are modified using those modification coefficients which have been obtained through complicated computing processes. Accordingly, there remain questions as to whether values of the modification coefficients are correct in themselves, and whether all battery characteristics are modified.

In addition, because some type of electricity accumulating unit has characteristics such as charge efficiency and memory effect, those characteristics have to be also taken into consideration in the modification process to estimate the remaining capacity with high accuracy. Moreover, because initial characteristics of electricity accumulating units have individual differences, those individual differences have to be further taken into consideration in the modification process to estimate the remaining capacity with high accuracy.

Stated another way, in order to perform the status detection, e.g., the estimation of the remaining capacity, with high accuracy, it is required to faithfully make modeling of characteristics of the electricity accumulating unit and to take a plurality of parameters into account. Further, modification has to be performed in consideration of changes of those parameters depending on time and environment.

Thus, a great deal of time and labor are consumed to obtain initial characteristics and plural parameters of the electricity accumulating unit and to acquire data of the modification coefficients. In spite of processing being executed in a how complicated manner, however, the processing result falls within the scope of theory regarding battery characteristics or estimation based on a model, thus accompanying with a question as to whether the estimated result is correct with respect to a true value.

An object of the present invention is to provide a status detector for a power supply, a power supply, and an initial characteristic extracting device for use with the power supply, each of which can detect the status of an electricity accumulating unit with high accuracy.

The present invention provides a status detector for a power supply, which can detect the status of an electricity accumulating unit with high accuracy.

According to one major aspect of the present invention, the status detector for the power supply comprises a measuring unit capable of obtaining measured values of at least current, voltage and temperature of electricity accumulating unit; a memory unit for storing characteristic information of the electricity accumulating unit; a processing unit for executing status detection of the electricity accumulating unit by using the measured values and the characteristic information of the electricity accumulating unit which is stored in the memory unit; a discrepancy detecting unit for detecting the presence of a discrepancy away from a theoretical value when a result of the status detection obtained by the processing unit is changed over a predetermined threshold or reversed with respect to the measured values obtained by the measuring unit; and a modifying unit for modifying the characteristic information stored in the memory unit depending on the discrepancy detected by the discrepancy detecting unit.

Also, the present invention provides a power supply, which can detect the status of an electricity accumulating unit with high accuracy.

According to another major aspect of the present invention, the power supply comprises an electricity accumulating unit capable of being charged and discharged; a measuring unit for obtaining information of the electricity accumulating unit during charge and discharge; and a status detecting unit for detecting status of the electricity accumulating unit, the status detecting unit comprising: a measuring unit capable of obtaining measured values of at least current, voltage and temperature of the electricity accumulating unit; a memory unit for storing characteristic information of the electricity accumulating unit; a processing unit for executing status detection of the electricity accumulating unit by using the measured values and the characteristic information of the electricity accumulating unit which is stored in the memory unit; a discrepancy detecting unit for detecting the presence of a discrepancy away from a theoretical value when a result of the status detection obtained by the processing unit is changed over a predetermined threshold or reversed with respect to the measured values obtained by the measuring unit; and a modifying unit for modifying the characteristic information stored in the memory unit depending on the discrepancy detected by the discrepancy detecting unit.

Further, the present invention provides an initial characteristic extracting device for use with a power supply, which can detect the status of an electricity accumulating unit with high accuracy.

According to still another major aspect of the present invention, the initial characteristic extracting device for use with the power supply comprises an electricity accumulating unit capable of being charged and discharged; a measuring unit for obtaining information of the electricity accumulating unit during charge and discharge; and a status detecting unit for detecting status of the electricity accumulating unit, the status detecting unit comprising: a measuring unit capable of obtaining measured values of at least current, voltage and temperature of the electricity accumulating unit; a memory unit for storing characteristic information of the electricity accumulating unit; a processing unit for executing status detection of the electricity accumulating unit by using the measured values and the characteristic information of the electricity accumulating unit which is stored in the memory unit; a discrepancy detecting unit for detecting the presence of a discrepancy away from a theoretical value when a result of the status detection obtained by the processing unit is changed over a predetermined threshold or reversed with respect to the measured values obtained by the measuring unit; and a modifying unit for modifying the characteristic information stored in the memory unit depending on the discrepancy detected by the discrepancy detecting unit, the initial characteristic extracting device further comprising a charging/discharging device for charging and discharging the electricity accumulating unit in accordance with a predetermined pulse pattern, the charging/discharging device performing charge and discharge of the electricity accumulating unit, the measuring unit measuring the information of the electricity accumulating unit during the charge and the discharge, the processing unit detecting the status of the electricity accumulating unit by using the measured values and the characteristic information of the electricity accumulating unit which is stored in the memory unit, the discrepancy detecting unit detecting the presence of a discrepancy of the detected status away from the theoretical value, and the modifying unit modifying the characteristic information such that the characteristic information is converged within a certain range and the converged characteristic information is extracted as an initial characteristic of the electricity accumulating unit.

According to the present invention, it is possible to detect the status of the electricity accumulating unit with high accuracy.

BRIEF DESCRIPTION OF THE DRAWINGS

FIG. 3 is a circuit diagram showing an equivalent circuit of an electricity accumulating unit used in the power supply according to the first embodiment of the present invention;

FIG. 4 is a graph for explaining the characteristic information between OCV (Open Circuit Voltage) and SOC (State Of Charge) in the power supply according to the first embodiment of the present invention;

DESCRIPTION OF THE PREFERRED EMBODIMENTS

The configuration and operation of a power supply according to a first embodiment of the present invention will be described below with reference to FIGS. 1-6.

The configuration of the power supply according to this embodiment will be first described with reference to FIG. 1.

Figure 1:
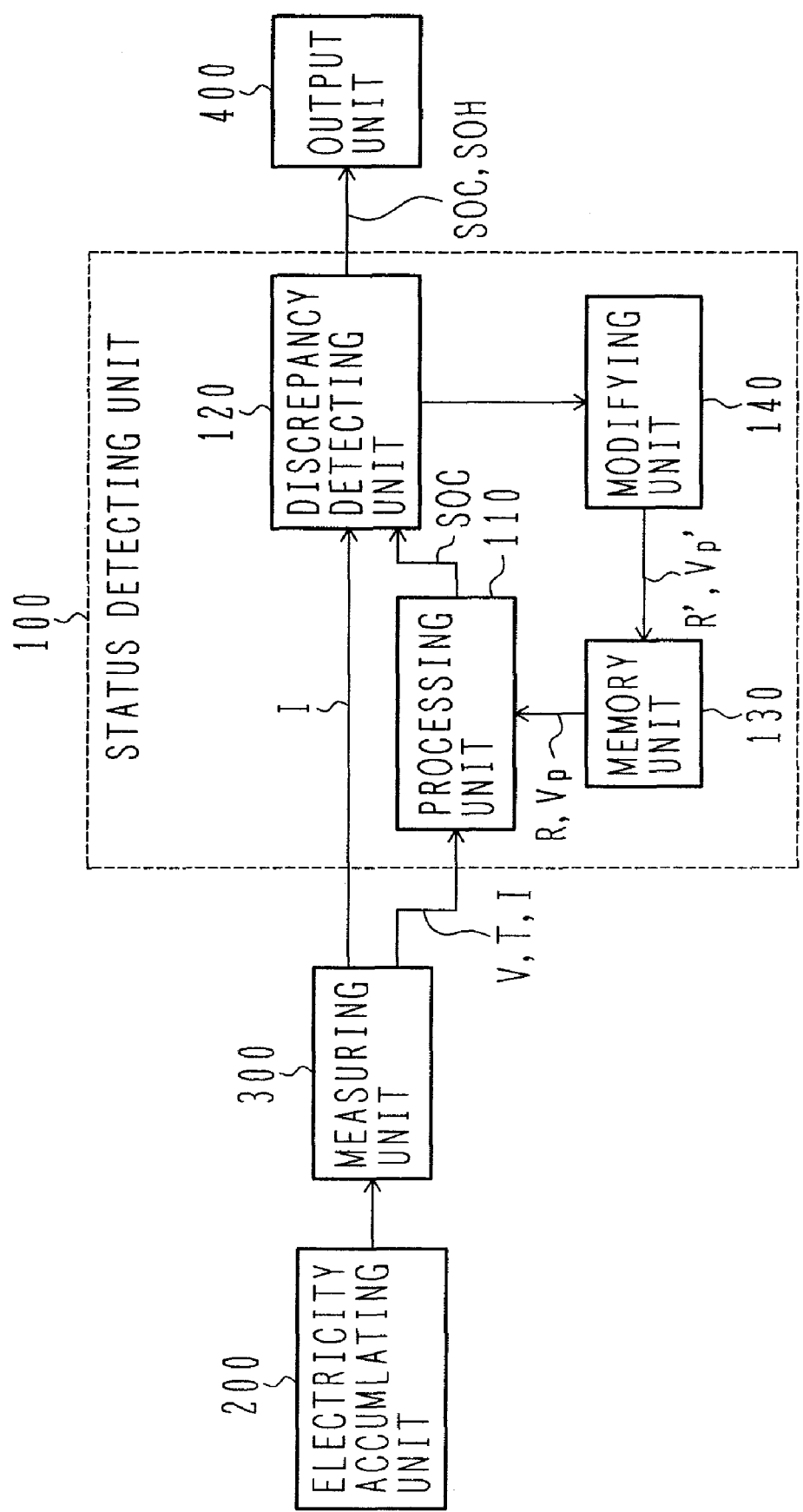
FIG. 1 is a block diagram showing the configuration of a power supply according to a first embodiment of the present invention.

FIG. 1 is a block diagram showing the configuration of the power supply according to the first embodiment of the present invention.

The power supply of this embodiment comprises a status detecting unit 100, an electricity accumulating unit 200, a measuring unit 300, and an output unit 400. The electricity accumulating unit 200 serves to accumulate electricity and discharge the accumulated electricity, and it is, e.g., a lithium secondary battery. This embodiment can also be applied to the case of using, as the electricity accumulating unit 200, other similar device with the function of storing electricity, such as a nickel-hydrogen battery, a lead-acid battery, and an electric double-layer capacitor. The electricity accumulating unit 200 may be a single cell or may have a modular structure including a plurality of single cells combined with each other.

The measuring unit 300 is constituted by sensors and electrical circuits for obtaining information (such as a voltage V, a current I, and a temperature T) of the electricity accumulating unit 200.

The status detecting unit 100 comprises a processing unit 110, a discrepancy detecting unit 120, a memory unit 130, and a modifying unit 140.

The processing unit 110 computes SOC (State Of Charge) of the electricity accumulating unit 200 based on measured values (V, I, T) obtained from the measuring unit 300 and characteristic information (including a polarization voltage Vp and an internal DC resistance R) of the electricity accumulating unit 200, which is read out of the memory unit 130.

The processing unit 110 is constituted by, e.g., a microprocessor or a computer. An SOC computing method executed by the processing unit 110 will be described later with reference to FIGS. 3 and 4.

The discrepancy detecting unit 120 monitors whether there is such a discrepancy that the result obtained by the processing unit 110 is away from a theoretical value, based on the measured value (I) obtained from the measuring unit 300 and the SOC computed by the processing unit 110. If the result obtained by the processing unit 110 is away from the theoretical value, this is detected as being a discrepancy. A practical discrepancy detecting method executed by the discrepancy detecting unit 120 will be described later with reference to FIGS. 5 and 6.

The modifying unit 140 modifies the characteristic information (e.g., the polarization voltage Vp and the internal DC resistance R) stored in the memory unit 130. The modifying unit 140 may be started only when the discrepancy detecting unit 120 detects a discrepancy away from the theoretical value, or it may be started regardless of whether there is a discrepancy away from the theoretical value.

When the modifying unit 140 is started regardless of whether there is a discrepancy away from the theoretical value, it modifies the characteristic information using a predetermined modification amount if the discrepancy detecting unit 120 detects a discrepancy away from the theoretical value. If there is no discrepancy away from the theoretical value, the characteristic information is modified with the modification amount set to 0. Also, the modifying unit 140 modifies the characteristic information depending on the nature of a discrepancy away from the theoretical value, which has been detected by the discrepancy detecting unit 120. The operation of the modifying unit 140 will be described later.

The memory unit 130 stores the characteristic information that can be obtained from the electricity accumulating unit 200 in advance, such as the internal DC resistance, the polarization voltage, the charge efficiency, the allowable current, and the fully charged capacity. These items of the characteristic information may have characteristic values for each of charge and discharge, or may have values depending on the status of the electricity accumulating unit 200, such as SOC or temperature. As an alternative, each item of the characteristic information may be set to one value common to all states of the electricity accumulating unit 200.

The memory unit 130 is formed of any suitable memory, e.g., a flash memory, EEPROM, or a magnetic disk. The memory unit 130 may be provided externally of the processing unit 110, or may be an internal memory incorporated inside the processing unit 110. In addition to the characteristic information of the electricity accumulating unit 200, the memory unit 130 may store processing procedures for detecting the status of the electricity accumulating unit 200.

The memory unit 130 may be removal. When the memory unit 130 is made removal, the characteristic information and the processing procedures can be easily changed by replacing the memory unit 130. Further, by preparing a plurality of replaceable memory units 130 and storing the characteristic information and the processing procedures in those memory units 130 in a distributed way, it is possible to more finely update the characteristic information and the processing procedures.

The output unit 400 outputs the SOC obtained by the processing unit 110, etc. to the exterior.

The operation of the status detecting unit 100 in the power supply of this embodiment will be described below with reference to FIGS. 2-6.

Overall processing executed by the status detecting unit 100 in the power supply of this embodiment will be described with reference to FIG. 2.

Figure 2:
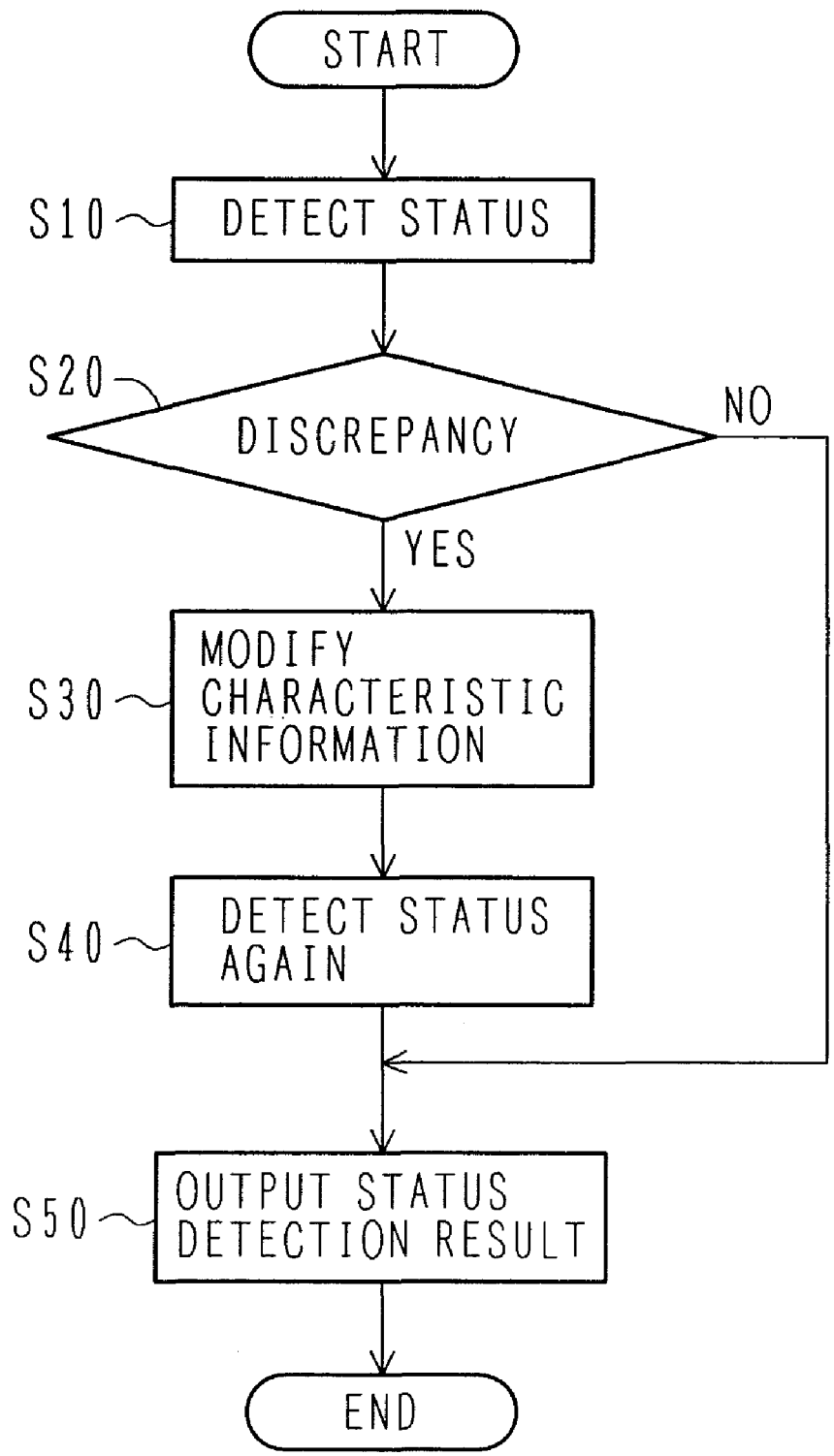
FIG. 2 is a flowchart showing processing procedures executed by a status detecting unit used in the power supply according to the first embodiment of the present invention.

FIG. 2 is a flowchart showing processing procedures executed by the status detecting unit used in the power supply according to the first embodiment of the present invention.

In step S10 of FIG. 2, the processing unit 110 executes status detection by computing SOC of the electricity accumulating unit 200 based on the measured values (V, I, T) of the electricity accumulating unit 200 and the characteristic information (including the polarization voltage Vp and the internal DC resistance R) of the electricity accumulating unit 200, which is read out of the memory unit 130.

A description is here made of processing procedures of the processing unit 110 in the status detecting unit 100 of this embodiment with reference to FIGS. 3 and 4.

FIG. 3 is a circuit diagram showing an equivalent circuit of the electricity accumulating unit used in the power supply according to the first embodiment of the present invention. FIG. 4 is a graph for explaining the characteristic information between OCV (Open Circuit Voltage) and SOC (State Of Charge) in the power supply according to the first embodiment of the present invention.

FIG. 3 shows an equivalent circuit of the electricity accumulating unit 200. The electricity accumulating unit 200 is represented by an in-series connection containing a pair of an impedance Z and a capacitance component C connected in parallel, an internal DC resistance R, and an electromotive force OCV.

When a current I is applied to the electricity accumulating unit 200, an inter-terminal voltage (CCV; Closed Circuit Voltage) of the electricity accumulating unit 200 is expressed by the following formula (1);

$$CCV = OCV + I \cdot R + Vp \tag{1}$$

In this formula, Vp represents the polarization voltage and corresponds to a voltage across the pair of the impedance Z and the capacitance component C connected in parallel.

The electromotive force OCV is used for computing SOC, but it cannot be directly measured in a condition that the electricity accumulating unit 200 is being charged or discharged. Therefore, the electromotive force OCV is computed by subtracting an IR drop and the polarization voltage Vp from the electromotive force CCV as expressed by the following formula (2).

$$OCV = CCV - I \cdot R - Vp \tag{2}$$

Here, the internal DC resistance R and the polarization voltage Vp can be obtained from the characteristic information stored in the memory unit 130. The internal DC resistance R and the polarization voltage Vp have values depending on the SOC, temperature, etc. of the electricity accumulating unit 200. The current value I is obtained from a value measured by the measuring unit 300.

FIG. 4 shows the relationship between the electromotive force OCV and SOC. After the electromotive force OCV is computed using the current value I, the internal DC resistance R and the polarization voltage Vp based on the formula (2), the SOC of the electricity accumulating unit 200 can be estimated from the characteristic information between the electromotive force OCV and SOC, which has been obtained in advance.

The processing unit 110 transmits the thus-estimated SOC to the discrepancy detecting unit 120.

Returning to FIG. 2, in step S20, the discrepancy detecting unit 120 monitors whether there is a discrepancy away from the theoretical value, based on the SOC received from the processing unit 110 and the measured value (I) received from the measuring unit 300. If there is no discrepancy, the control flow proceeds to step S50, and if there is a discrepancy, the control flow proceeds to step S30.

Figure 5A:
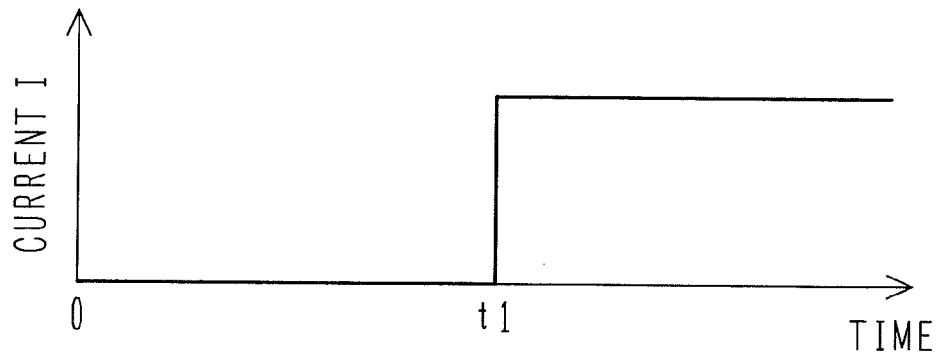
FIGS. 5A and 5B are charts for explaining changes of current and SOC during charge in the power supply according to the first embodiment of the present invention.
Figure 5B:
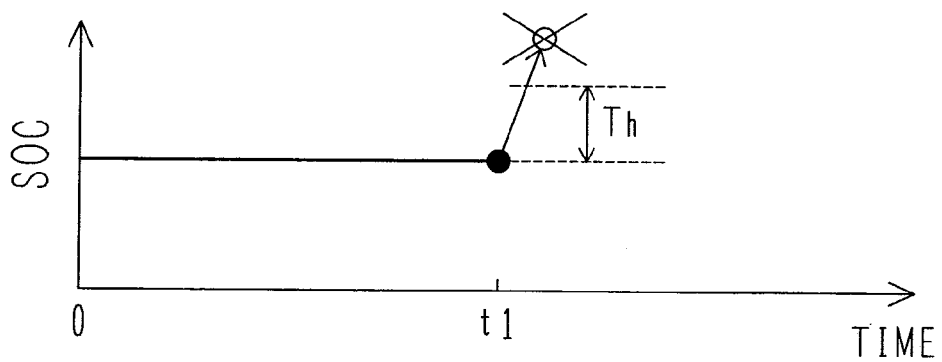
Figure 6:
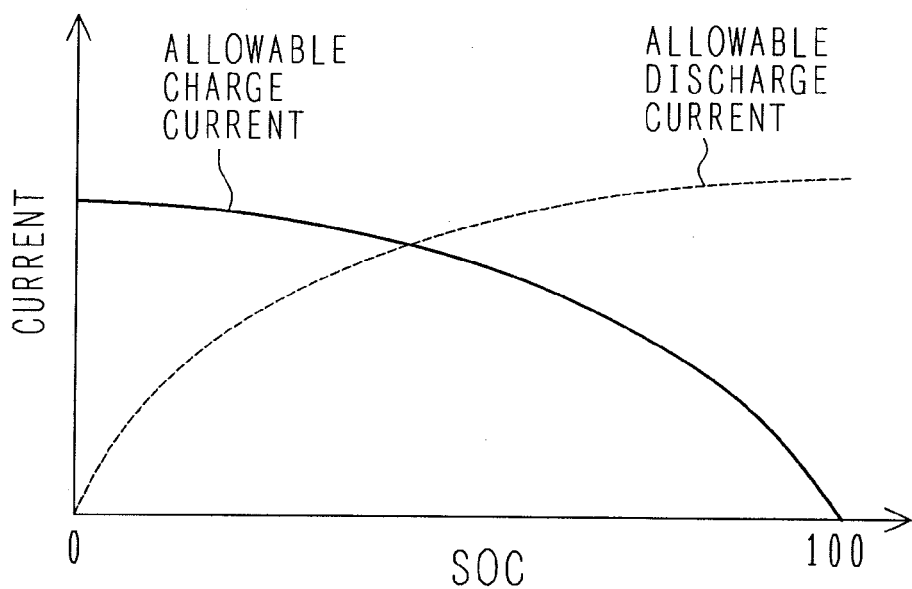
FIG. 6 is a graph showing SOC and allowable currents of the electricity accumulating unit in the power supply according to the first embodiment of the present invention.

A description is here made of processing procedures of the discrepancy detecting unit 120 in the status detecting unit 100 of this embodiment with reference to FIGS. 5 and 6.

FIGS. 5A and 5B are charts for explaining changes of current and SOC during charge in the power supply according to the first embodiment of the present invention.

FIG. 5A shows change of the current, and FIG. 5B shows change of the SOC obtained by the processing unit 110. As shown in FIG. 5A, when charge to the electricity accumulating unit 200 is started at a time t1, the current I changes from 0 to a positive value. Correspondingly, as shown in FIG. 5B, the result (SOC) of the status detection computed by the processing unit 110 starts to increase from the time t1.

At that time, the discrepancy detecting unit 120 monitors whether the increase of SOC does not exceed a predetermined threshold Th. If the SOC has increased over the predetermined threshold Th as shown in FIG. 5B, the discrepancy detecting unit 120 determines that the change of SOC is excessive and is discrepant away from the theoretical value.

The foregoing is related to the state of starting the charge. When the current value I is reduced from 0 in the discharge state, the discrepancy detecting unit 120 monitors a decrease of SOC, i.e., a decrease of the result computed by the processing unit 110. If the SOC has decreased over the predetermined threshold Th, the discrepancy detecting unit 120 determines that the change of SOC is discrepant away from the theoretical value, thus indicating detection of a discrepancy.

The threshold Th used for determining whether the change of SOC is excessive is obtained using an allowable maximum charge or discharge current value Imax and a fully charged capacity Qmas, which are derived from the performance of the electricity accumulating unit 200, based on the following formula (3)

$$Th = \Delta SOCmax = 100 \times Imax / Qmax \tag{3}$$

Looking from the specific performance of the electricity accumulating unit 200, the SOC will never change over $\Delta SOCmax$ no matter what condition is. Accordingly, if the computed SOC has increased or decreased over $\Delta SOCmax$, this can be determined as indicating a discrepancy away from the theoretical value.

The case of changing the threshold Th depending on the performance and status of the electricity accumulating unit 200 will be described with reference to FIG. 6.

FIG. 6 is a graph showing SOC and allowable currents of the electricity accumulating unit in the power supply according to the first embodiment of the present invention.

As shown in FIG. 6, as the SOC increases, an allowable charge current is increased, while an allowable discharge current is decreased. Assuming an upper limit voltage and a lower limit voltage of the electricity accumulating unit 200 to be Vmax and Vmin, an allowable charge current Icmax and an allowable discharge current Idmax are expressed by the following formulae (4) and (5), respectively;

$$Icmax = (Vmax - OCV) / Rz \tag{4}$$

$$Idmax = (OCV - Vmin) / Rz \tag{5}$$

wHere Rz represents an equivalent impedance of R, Z and C shown in FIG. 3.

An SOC maximum increase amount $\Delta SOCcmax$ during charge and an SOC maximum decrease amount $\Delta SOCdmax$ during discharge depending on the performance, temperature and SOC of the electricity accumulating unit 200 are obtained using the fully charged capacity Qmax of the electricity accumulating unit 200 based on the following formulae (6) and (7), respectively:

$$\Delta SOCcmax = 100 \times Icmax / Qmax \tag{6}$$

$$\Delta SOCdmax = 100 \times Idmax / Qmax \tag{7}$$

The SOC of the electricity accumulating unit 200 will never increase over ΔSOCcmax during charge and it will never decrease over ΔSOCdmax during discharge. Accordingly, the discrepancy detecting unit 120 can use each of ΔSOCcmax and ΔSOCdmax as the threshold Th that is variable depending on the performance, temperature and SOC of the electricity accumulating unit 200. In other words, a discrepancy can be detected by using the SOC maximum increase amount ΔSOCcmax during charge and the SOC maximum decrease amount ΔSOCdmax during discharge not only when the current is stepwisely changed as in the state of starting charge, as shown in FIG. 5, but also when the current is moderately changed.

The above-described manner of deciding the threshold Th represents the case where the performance of the electricity accumulating unit 200 is taken into consideration. By additionally considering the maximum allowable charge and discharge currents depending on a system in which the electricity accumulating unit 200 is used as the power supply, the threshold Th can be decided with higher reliability. To describe a manner of deciding the threshold Th during discharge, for example, even with the maximum allowable discharge current of the electricity accumulating unit itself being 200 A, when the electricity accumulating unit is used in an actual system in the form of a vehicle, a maximum current value used in the system is 100 A in some case. In that case, the threshold Th can be decided by using 100 A as the maximum allowable discharge current. To describe a manner of deciding the threshold Th during charge, even with the maximum allowable charge current of the electricity accumulating unit itself being 200 A, when the electricity accumulating unit is used in an actual system in the form of a vehicle, a maximum generation current of a generator motor (M/G) used as an alternator or a generator is 100 A in some case. In that case, the threshold Th can be decided by using 100 A as the maximum allowable charge current.

Returning to FIG. 2, if a discrepancy is detected in step S20, the modifying unit 140 modifies the characteristic information and stores the modified characteristic information in the memory unit 130 in step S30.

To cope with the discrepancy away from the theoretical value, the modifying unit 140 increases the value of the internal DC resistance R and stores a modified internal DC resistance R' as new characteristic information in the memory unit 130 to be used from the subsequent processing as the new characteristic information.

The internal DC resistance R may be modified by increasing the resistance value by 1%, or by a minimum unit for the value representing the characteristic information. As another method, a modification amount may be set to be larger as the discrepancy away from the theoretical value is increased, and to be smaller as the discrepancy away from the theoretical value is decreased. The minimum unit for the value representing the characteristic information means a minimum unit corresponding to a digit of the internal DC resistance, which can be distinctively stored in the memory unit 130. Assuming a minimum value of the internal DC resistance to be, e.g., 0.1 mΩ, the internal DC resistance is increased in units of 0.1 mΩ.

When it is desired to dynamically change the modification, the following method can be used, by way of example. If the SOC is changed over the threshold Th, the state of charge SOCth is obtained using the state of charge SOCold in the preceding cycle based on the following formula (8):

$$SOCth = SOCold + Th \quad (8)$$

An electromotive force OCVth corresponding to the state of charge SOCth can be obtained from the relationship between the electromotive force OCV and SOC shown in FIG. 4. By using the obtained OCVth, the formula (2) can be rewritten to the following formula (9):

$$OCVth = CCV - I \cdot Rth - Vp \quad (9)$$

By rearranging the formula (9), Rth providing change of SOC, which will not exceed the threshold Th, can be expressed by the following formula (10):

$$Rth = (CCV - OCVth - Vp)/I \quad (10)$$

The modifying unit 140 modifies the internal DC resistance so that Rth expressed by the formula (10) is obtained. Thus, the modification amount of the characteristic information can be changed in a dynamic manner.

The operation of the discrepancy detecting unit 120 will be described below in connection with the case where the current value I measured by the measuring unit 300 indicates charge and the result of the status detection executed by the processing unit 110 shows a decrease of SOC, or the case where the current value indicates discharge and the result of the status detection shows an increase of SOC.

When the current value I of the electricity accumulating unit 200 measured by the measuring unit 300 indicates charge and the result of the status detection executed by the processing unit 110 shows a decrease of SOC, i.e., "reversal", the discrepancy detecting unit 120 detects such a condition to be a discrepancy away from the theoretical value. Also, when the current value I measured by the measuring unit 300 indicates discharge and the result of the status detection shows an increase of SOC, i.e., "reversal", the discrepancy detecting unit 120 similarly detects such a condition to be a discrepancy away from the theoretical value.

The discrepancy detecting unit 120 may determine the detection of a discrepancy in the case where the SOC shows the reversal even just a little with respect to the measured current value, or may determine the detection of a discrepancy with a margin allowing the reversal of SOC up to a predetermined value set within the range not exceeding the threshold Th.

When the reversal of SOC is detected, the modifying unit 140 makes modification to decrease the value of the internal DC resistance R. An internal DC resistance R' modified by a predetermined amount is stored as new characteristic information in the memory unit 130, and the stored new characteristic information is used from the subsequent processing.

Table 1, given below, lists the operation of the discrepancy detecting unit 120 to detect a discrepancy away from the theoretical value, the cause of the discrepancy, and a modification action executed by the modifying unit 140 to overcome the discrepancy. As seen from Table 1, the discrepancy detecting unit 120 detects, as a discrepancy away from the theoretical value, the excessive change of SOC caused by too small R and the reversal of SOC caused by too large R, and the modifying unit 140 modifies R depending on the nature of the discrepancy. Accordingly, the status detection of the electricity accumulating unit 200 can be performed by using R that causes neither the excessive change of SOC nor the reversal of SOC.

TABLE 1

| Operation of discrepancy detecting unit | Cause | Modification action of modifying unit |
|---|---|---|
| detect excessive change of SOC | too small R | increase R |
| detect reversal of SOC | too large R | decrease R |

Returning to FIG. 2, in step S40, the processing unit 110 detects the status of the electricity accumulating unit 200 again by using the new characteristic information so that the result of the status detection is obtained with higher accuracy.

Then, in step S50 of FIG. 2, the obtained result of the status detection is transmitted to the output unit 400 and is outputted to the exterior from the output unit 400.

In the above description, the discrepancy detecting unit 120 and the modifying unit 140, shown in FIG. 1, may be constituted by separate microprocessors or computers. As an alternative, the discrepancy detecting unit 120 and the modifying unit 140 may be realized with one microprocessor or computer that executes the processing of both the units 120 and 140 together. The processing unit 110, the discrepancy detecting unit 120, and the modifying unit 140 are interconnected via communication units capable of transferring information and commands among them.

While the discrepancy detecting unit 120 and the modifying unit 140 are shown in FIG. 1 as being installed externally of the processing unit 110, those units may be constituted in the forms of program modules or subroutines executing the above-described processing procedures, and may be realized with one processing sequence containing the processing procedures of both the discrepancy detecting unit 120 and the modifying unit 140 together. In that case, the discrepancy detecting unit 120 and the modifying unit 140 are stored as software in the memory unit 130 and executed by the processing unit 110.

The output unit 400 comprises LAN, CAN, radio LAN or short-range radio communication utilizing the so-called CSMA/CD system, or a device for transferring an ON-OFF signal, such as a photocoupler or a relay, and an associated circuit. The output unit 400 may use wired communication or radio communication. A display unit, such as a display monitor, may be used as the output unit 400 to display only the result of the current status detection or to display a time-serial graph in which the results of the current and past status detections are indicated together.

Further, by employing a microcomputer in which an A/D converter, a flash memory, a microprocessor and a communication circuit are constituted on the same device, the measuring unit 300, the memory unit 130, the processing unit 110, the discrepancy detecting unit 120, the modifying unit 140, and the output unit 400 used in this embodiment can be constituted on the same device. Additionally, those units can be shared by another control unit.

According to this embodiment, as described above, when the discrepancy detecting unit 120 detects the excessive change of SOC, the modification to increase the internal DC resistance R is performed, and when the discrepancy detecting unit 120 detects the reversal of SOC, the modification to decrease the internal DC resistance R is performed. As a result, the status of the electricity accumulating unit 200 can be detected with high accuracy in spite of parameters being changed depending on time and environment.

The configuration and operation of a power supply according to a second embodiment of the present invention will be described below with reference to FIGS. 1 and 7.

Figure 7:
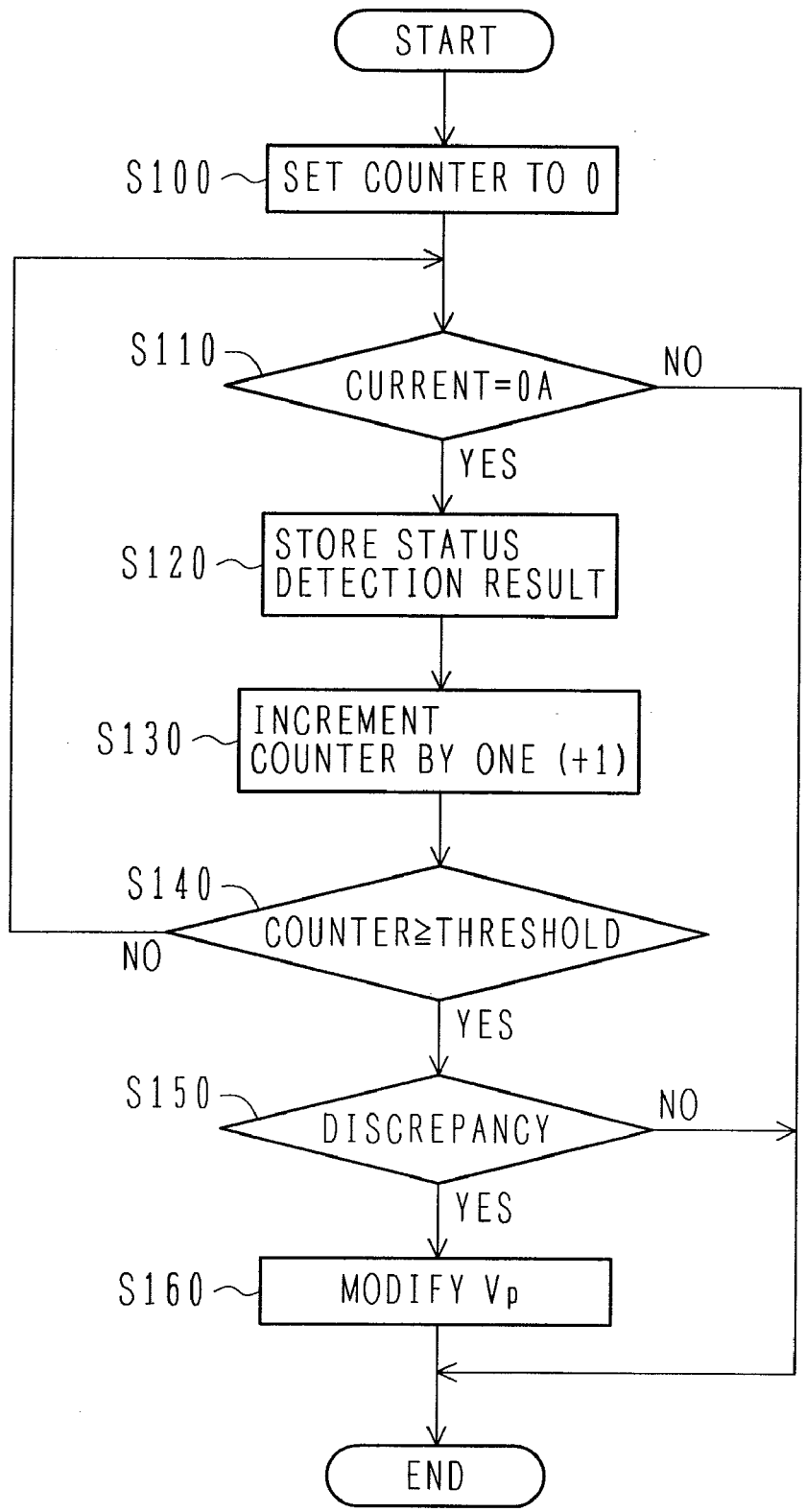
FIG. 7 is a flowchart showing the operation of a discrepancy detecting unit in a power supply according to a second embodiment of the present invention.

FIG. 7 is a flowchart showing the operation of a discrepancy detecting unit in the power supply according to the second embodiment of the present invention;

The overall configuration of the power supply according to this embodiment is the same as that shown in FIG. 1. In this embodiment, processing procedures executed by the discrepancy detecting unit 120 differs from those shown in FIG. 2.

After charge or discharge of the electricity accumulating unit 200 has finished, i.e., when the current value among the measured values has come into a state indicating 0 A, it is normal that the SOC will not change in environment where self-discharge is negligible. In view of that fact, the discrepancy detecting unit 120 monitors the SOC obtained by the processing unit 110 after the charge or discharge has finished. If a change is found in the estimated SOC, this is detected as indicating a discrepancy away from the theoretical value.

A practical discrepancy detecting method executed by the discrepancy detecting unit 120 will be described below with reference to FIG. 7.

In step S100, the discrepancy detecting unit 120 set 0 in a counter prepared for counting the number of estimation results of SOC.

Then, in step S110, the discrepancy detecting unit 120 monitors the current value among the measured values, and when the current value has become 0 A, it determines that the charge or discharge of the electricity accumulating unit 200 has finished.

Then, in step S120, the result of detecting the status of the electricity accumulating unit 200 after determination that the charge or discharge has finished, is stored in, e.g., a rewritable memory within the processing unit 110. In step S130, a value of the counter is incremented by one. At this time, the value set in the counter is 1.

Then, in step S140, the discrepancy detecting unit 120 monitors whether the counter value exceeds a predetermined threshold that has been prepared in advance. If the counter value does not exceed the predetermined threshold, the control flow returns to step S110. In step S110, the present status of the electricity accumulating unit 200 is monitored, and if neither charge nor discharge is being performed, the result of detecting the status of the electricity accumulating unit 200 is stored in addition to the previously stored result. The counter value is further incremented by one to become 2 at this time. The above-described procedures are repeated until the counter value exceeds the predetermined threshold, while successively storing the estimation results of SOC after the end of the charge and discharge.

If the counter value exceeds the predetermined threshold, the discrepancy detecting unit 120 analyzes, in step S150, the plural results of the status detection which have been stored in the memory, thereby confirming a change of SOC in the condition where the electricity accumulating unit 200 is under neither charge nor discharge. Because the results stored in the memory correspond to the condition where the electricity accumulating unit 200 is under neither charge nor discharge, it is normal that the change of SOC is not found. Accordingly, if the change of SOC is found, the discrepancy detecting unit 120 determines that there occurs a discrepancy away from the theoretical value.

If there occurs a discrepancy, the modifying unit 140 modifies the polarization voltage Vp in step S160.

The threshold is set to a value of 2 or more. When the threshold is set to 2, care should be paid because of a possibility that the change of SOC caused by a sensing error or the like may be detected as indicating a discrepancy away from the theoretical value.

The modifying unit 140 may be started only when the discrepancy detecting unit 120 detects a discrepancy away from the theoretical value, or it may be always started even when no discrepancy is detected. In the latter case, the modifying unit 140 modifies the polarization voltage Vp with a modification amount set to 0 when no discrepancy is detected, and it modifies the polarization voltage Vp by a predetermined modification amount when a discrepancy is detected.

If the measured value other than the current of 0 A is received before the counter value exceeds the predetermined threshold, i.e., if the charge or discharge of the electricity accumulating unit 200 is started before the same, the stored results of the status detection is erased and the counter value is reset to 0. When the current of 0 A is detected next, the above-described processing is executed in a similar way.

A description is now made of a discrepancy detecting method executed by the discrepancy detecting unit 120 when the counter value exceeds the predetermined threshold. When the counter value exceeds the predetermined threshold, the discrepancy detecting unit 120 analyzes the two or more estimation results of SOC stored in the memory, and confirms a time-serial change of SOC. The time-serial change of SOC can be formed by using, e.g., the least square method. More specifically, by approximating two or more values of SOC with a linear line based on the least square method, the time-serial change of SOC can be expressed by a gradient k of the linear line. As an alternative, the time-serial change of SOC may be confirmed by totalizing time-serial change amounts of the stored estimation results of SOC, dividing the total change amount by the number of the stored estimation results of SOC to obtain an average change amount of SOC, and defining the average change amount as a change k of SOC.

Table 2, given below, lists the change k of SOC, which represents a discrepancy away from the theoretical value after the end of charge and discharge, and the modification of the polarization voltage Vp, which is executed by the modifying unit 140 to overcome the discrepancy.

TABLE 2

| Charge | Detection of k > 0 | Too large Vp | Decrease Vp |
| --- | --- | --- | --- |
| Charge | Detection of k < 0 | Too small Vp | Increase Vp |
| Discharge | Detection of k > 0 | Too small Vp | Increase Vp |
| Discharge | Detection of k < 0 | Too large Vp | Decrease Vp |

Thus, the status of the electricity accumulating unit 200 can be detected using Vp that causes neither an increase of SOC nor a decrease of SOC after the end of charge and discharge.

According to this embodiment, as described above, since the polarization voltage Vp is modified using the gradient k, the SOC estimation can be performed with high accuracy.

The configuration and operation of a power supply according to a third embodiment of the present invention will be described below with reference to FIGS. 1, 8 and 9.

Figure 8:
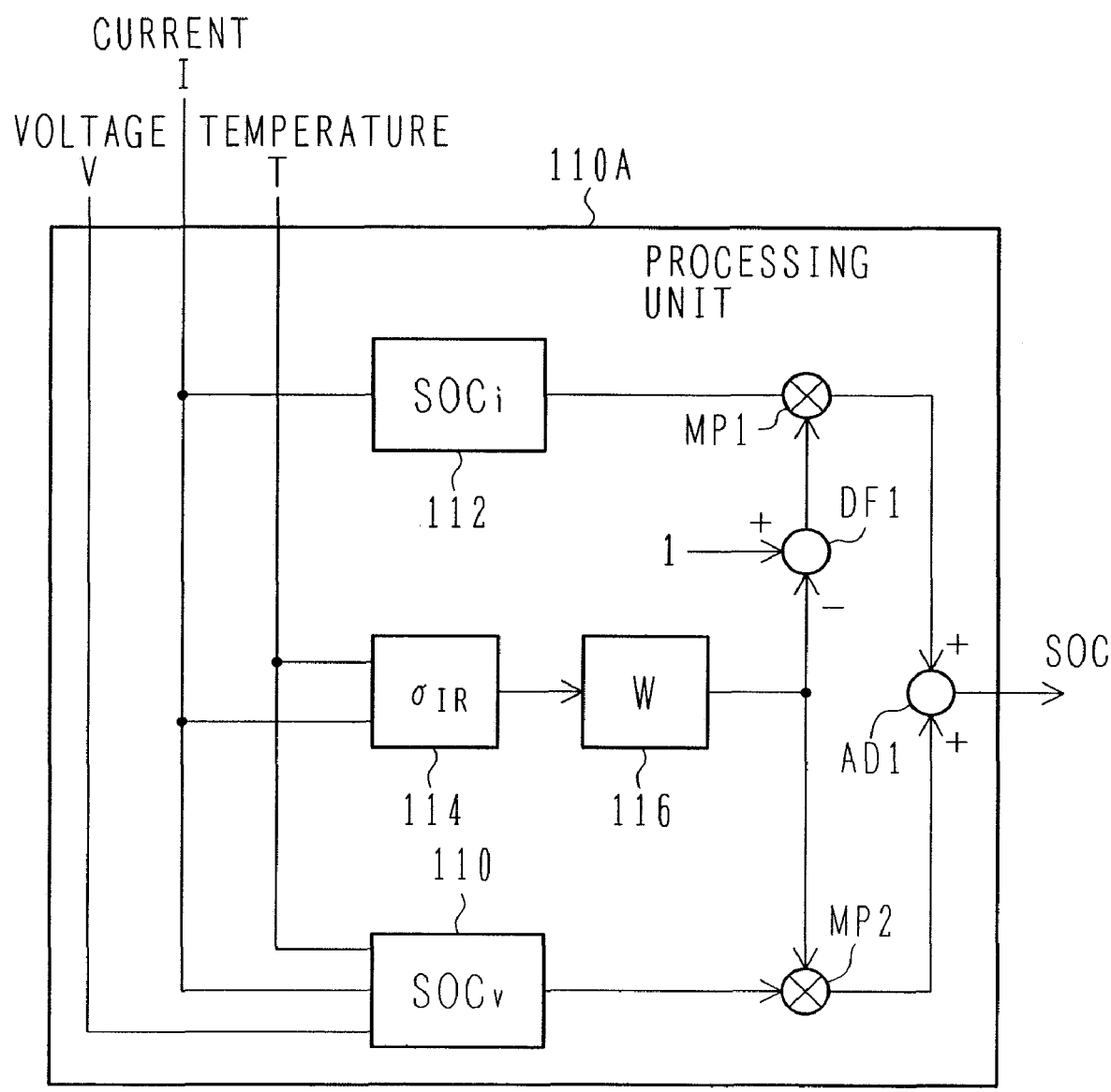
FIG. 8 is a block diagram showing the configuration of a processing unit in a status detecting unit used in a power supply according to a third embodiment of the present invention.

FIG. 8 is a block diagram showing the configuration of a processing unit in a status detecting unit used in the power supply according to the third embodiment of the present invention. FIG. 9 is a graph for explaining temperature-dependent changes of internal DC resistance of an electricity accumulating unit used in the power supply according to the third embodiment of the present invention.

The overall configuration of the power supply according to this embodiment is the same as that shown in FIG. 1. In this embodiment, the processing unit in the status detecting unit is constituted as shown in FIG. 8 described below.

A state-of-charge SOCv detecting unit 110 corresponds to the processing unit 110 in FIG. 1 and estimates SOC based on the graph of FIG. 4 by using the OCV obtained from the formula (2).

A state-of-charge SOCi detecting unit 112 obtains, from a current sensor, a current I charged to or discharged from the electricity accumulating unit 200 and calculates SOC based on the following formula (11):

$$SOCi = SOC + 100 \times \int I / Q_{max} \qquad (11)$$

An IR error detecting unit 114 calculates R·I by multiplying the current value I by the internal DC resistance R, thus obtaining an influence of error generated. A weight deciding unit 116 decides a weight (1/(1+R·I)) for SOCv and SOCi based on the error influence R·I obtained by the IR error detecting unit 114.

In general, each of detected results of voltage, current and temperature measured using sensors includes a substantially constant random error. Also, a current sensor generally has poorer accuracy than a voltage sensor. Therefore, the larger the current flowing through the electricity accumulating unit 200, the larger is an error contained in the current value I measured by the current sensor.

When obtaining the internal DC resistance R from the characteristic information, if the internal DC resistance R is derived corresponding to the temperature T, the internal DC resistance R contains an error because the temperature T obtained from a temperature sensor contains an error.

Further, when the electricity accumulating unit 200 has a modular structure in combination of plural units, the internal DC resistance R also contains an error due to variations in performance of individual electricity accumulating units 200.

Figure 9:
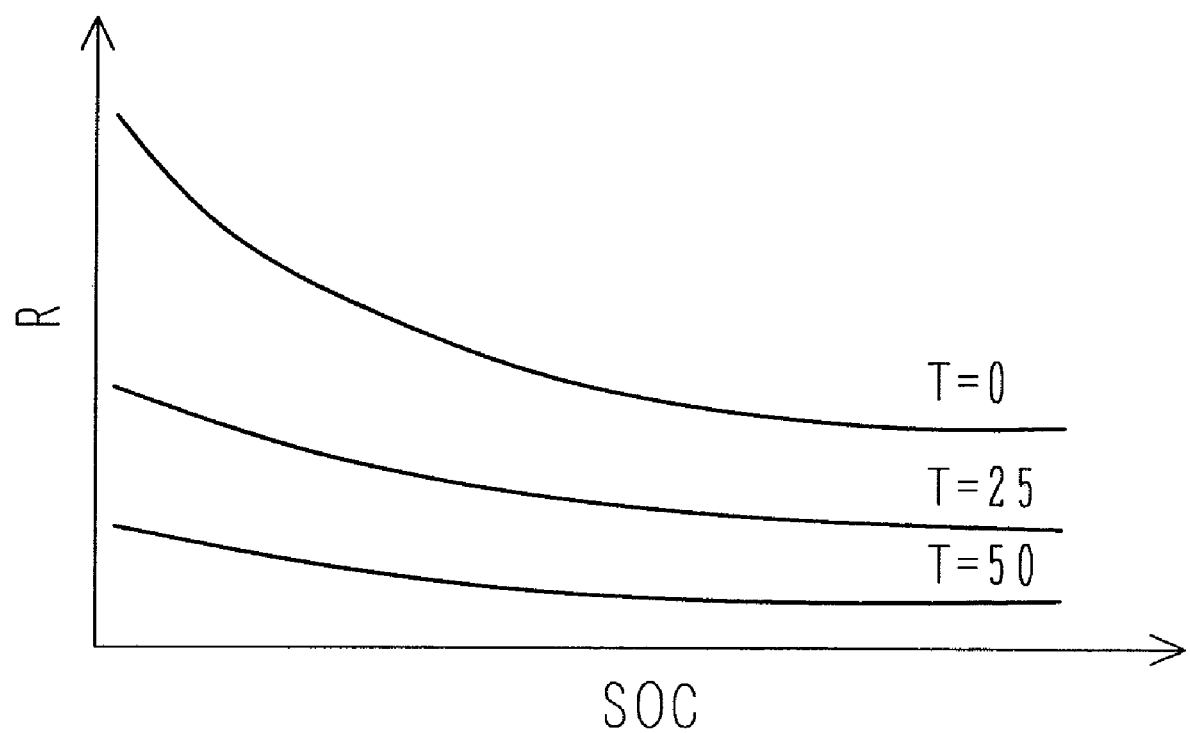
FIG. 9 is a graph for explaining temperature-dependent changes of internal DC resistance of an electricity accumulating unit used in the power supply according to the third embodiment of the present invention.

As shown in FIG. 9, the electricity accumulating unit 200 generally has such a tendency that the internal DC resistance R is relatively high at a lower value of SOC, and the value of the internal DC resistance R is increased as the temperature of the electricity accumulating unit 200 lowers. Also, the value of the internal DC resistance R is increased with deterioration of the electricity accumulating unit 200. The larger value of the internal DC resistance R increases an error contained therein.

The IR error detecting unit 114 calculates the above-mentioned error influence R·I by using the current value I and the temperature T measured by the sensors, or the former and the internal DC resistance R corresponding to SOC. Based on the calculated R·I, the weight deciding unit 116 decides a weight (W=(1/(1+R·I))) for SOCi and SOCv. For example, the weight of SOCv is set to be smaller at a lower value of SOC, a lower temperature, a larger extent of deterioration, or a larger current.

Assuming the weight of SOCv to be W, estimation of SOC in combination of SOCv and SOCi is executed based on the following formula (12):

$$SOCw = W \times SOCv + (1-W) \times SOCi \qquad (12)$$

To calculate SOCw based on the formula (12), a processing unit 110A includes a subtracter DF1 for obtaining (1−W), a multiplier MP2 for obtaining (W×SOCv), a multiplier MP1 for obtaining ((1−W)×SOCi), and an adder AD1 for adding outputs of the multipliers MP1 and MP2.

As described above, by obtaining SOCv while modifying the characteristic information and combining the obtained SOCv with SOCi based on the weight W depending on R·I, the status detection can be performed with high accuracy.

Figure 11A:
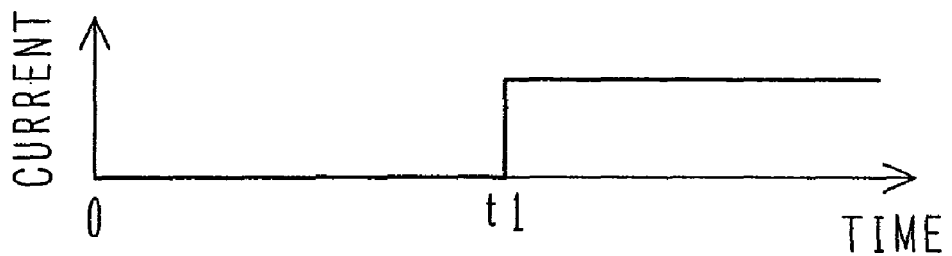
FIGS. 11A, 11B and 11C are graphs for explaining changes of SOC when an electricity accumulating unit in the power supply according to the fourth embodiment of the present invention is deteriorated.
Figure 11B:
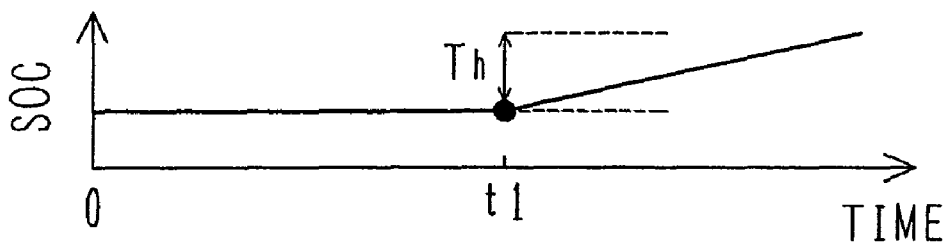
Figure 11C:
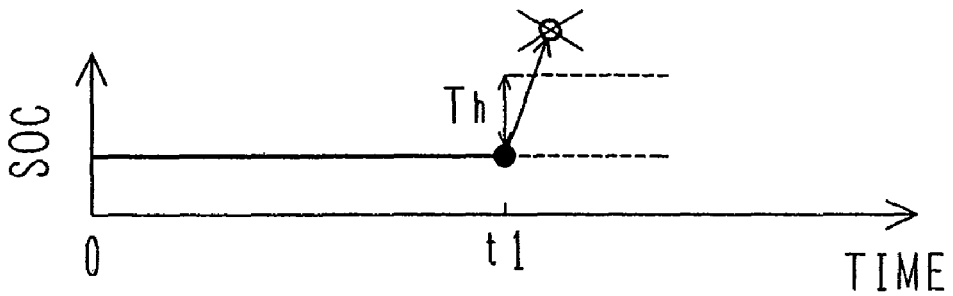
Figure 12:
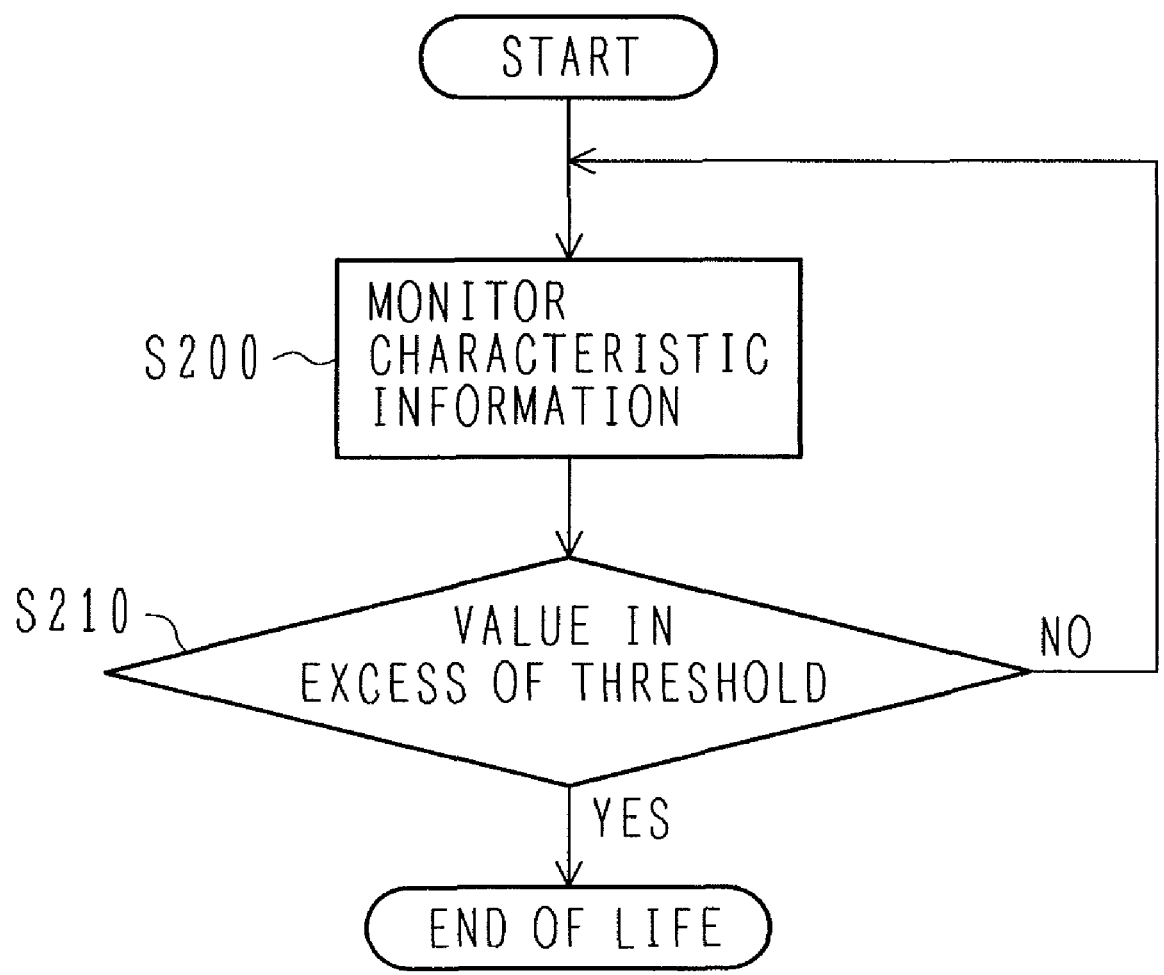
FIG. 12 is a flowchart showing processing procedures executed by a deterioration determining unit used in the power supply according to the fourth embodiment of the present invention.

The configuration of a power supply according to a fourth embodiment of the present invention will be described below with reference to FIGS. 10-12.

Figure 10:
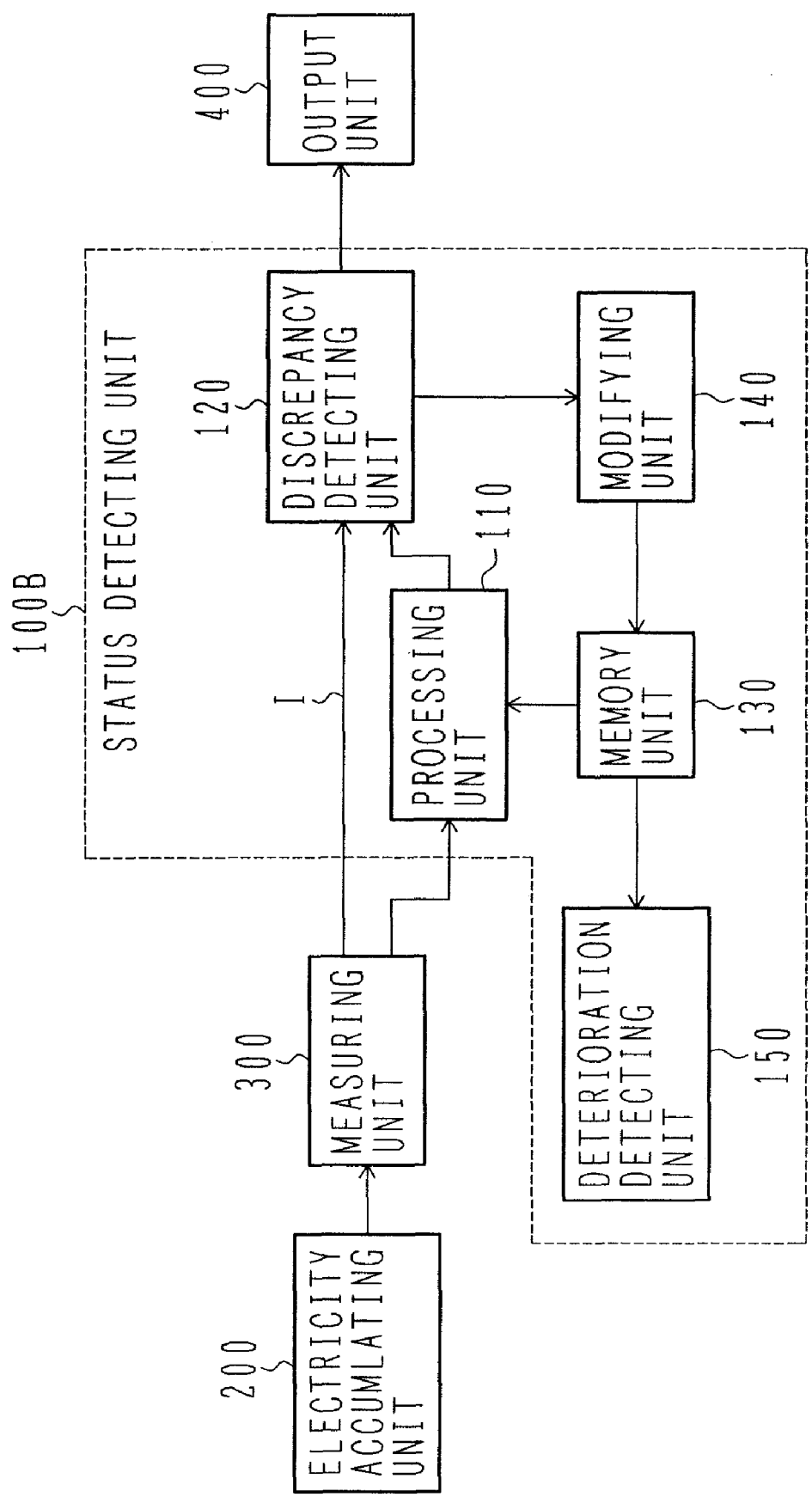
FIG. 10 is a block diagram showing the configuration of a power supply according to a fourth embodiment of the present invention.

FIG. 10 is a block diagram showing the configuration of a power supply according to a fourth embodiment of the present invention. The same reference numerals as those in FIG. 1 denote the same components. FIGS. 11A, 11B and 11C are graphs for explaining changes of SOC when an electricity accumulating unit in the power supply according to the fourth embodiment of the present invention is deteriorated. FIG. 12 is a flowchart showing processing procedures executed by a deterioration determining unit used in the power supply according to the fourth embodiment of the present invention.

In this embodiment, as shown in FIG. 10, a status detecting unit 100B includes a deterioration determining unit 150 in addition to the configuration shown in FIG. 1. The deterioration determining unit 150 periodically monitors the memory unit 130 and determines deterioration of the electricity accumulating unit 200.

When the electricity accumulating unit 200 is deteriorated, the internal DC resistance R of the electricity accumulating unit 200 is generally increased. In the electricity accumulating unit 200 having the increased internal DC resistance R, an IR drop caused upon application of the current I becomes larger than that in the initial state of the electricity accumulating unit 200.

When SOC of the deteriorated electricity accumulating unit 200 is estimated using the characteristic information obtained from the electricity accumulating unit 200 in the initial state, a discrepancy away from the theoretical value appears in the estimated result.

As shown in FIG. 11, the SOC exhibits an excessive change as the deterioration of the electricity accumulating unit 200 progresses. More specifically, at the stage where the electricity accumulating unit 200 is not deteriorated, when charge is started at a time t1 as shown in FIG. 11A, the change of SOC is within a threshold Th as shown in FIG. 11B. With the deterioration of the electricity accumulating unit 200, however, the SOC exhibits an excessive change due to an increase of the internal DC resistance R, as shown in FIG. 11C, to such an extent that the SOC estimated at the start of charge exceeds the threshold Th.

The discrepancy detecting unit 120 detects such an excessive change of SOC as being a discrepancy away from the theoretical value. If the discrepancy is detected, the modifying unit 140 modifies the characteristic information. In this case, the modifying unit 140 makes a modification to increase the internal DC resistance R and stores the increased internal DC resistance as new characteristic information in the memory unit 130.

When the electricity accumulating unit 200 is deteriorated, the status detecting unit 100B executes the above-described operation. When the electricity accumulating unit 200 is further deteriorated, the excessive change of SOC is detected again and the internal DC resistance R is modified. In that way, the status detecting unit 100B repeats those procedures as the deterioration of the electricity accumulating unit 200 progresses.

The operation of the deterioration determining unit 150 will be described below with reference to FIG. 12. The deterioration determining unit 150 monitors the characteristic information to be modified.

More specifically, in step S200, the deterioration determining unit 150 monitors the characteristic information, e.g., the internal DC resistance R in this embodiment.

Then, in step S210, the deterioration determining unit 150 checks whether any of values of the internal DC resistance R, which have been computed depending on the SOC of the electricity accumulating unit 200, temperature, etc., exceeds the predetermined threshold. If any value of the internal DC resistance R exceeds the predetermined threshold, the deterioration determining unit 150 determines that the electricity accumulating unit 200 comes to the end of life.

The deterioration determining unit 150 can be constituted as a microprocessor or a computer. The deterioration determining unit 150 may monitor the characteristic information by directly accessing the memory unit 130 as shown in FIG. 10, or may monitor the characteristic information read out of the memory unit 130 by the processing unit 110. Further, by providing a display unit associated with the deterioration determining unit 150, the progress of deterioration and the result of determining the end of life can be displayed on a display monitor or the like.

While the deterioration determining unit 150 is shown in FIG. 10 as being installed within the status detecting unit 100B, it may be constituted in the form of a program module or a subroutine. In that case, the deterioration determining unit 150 is stored as software in the memory unit 130 and executed by the processing unit 110. When the stored software of the deterioration determining unit 150 is executed by the processing unit 110, the deterioration determining unit 150 monitors the characteristic information through the above-described processing by directly monitoring the memory unit 130 or reading the characteristic information stored in the memory unit 130. The result of determining the end of life of the electricity accumulating unit 200 by the deterioration determining unit 150 is transmitted to the output unit 400 along with the result of the status detection of the electricity accumulating unit 200. Then, the progress of deterioration and the result of determining the end of life can be displayed (not shown) on another microprocessor or computer connected to the output unit 400.

The threshold used by the deterioration determining unit 150 for determining the end of life may be set to any desired value, e.g., a value twice or triple the internal DC resistance of the electricity accumulating unit 200. As an alternative, the threshold may be decided depending on the request from a system in which the electricity accumulating unit 200 is used as a power supply.

According to this embodiment, since the characteristic information is modified in match with the deterioration of the electricity accumulating unit 200, the life of the electricity accumulating unit 200 can be quantitatively determined by monitoring the characteristic information modified.

The configuration of an initial characteristic extracting device for use with a power supply according to a fifth embodiment of the present invention will be described below with reference to FIGS. 13-15.

Figure 13:
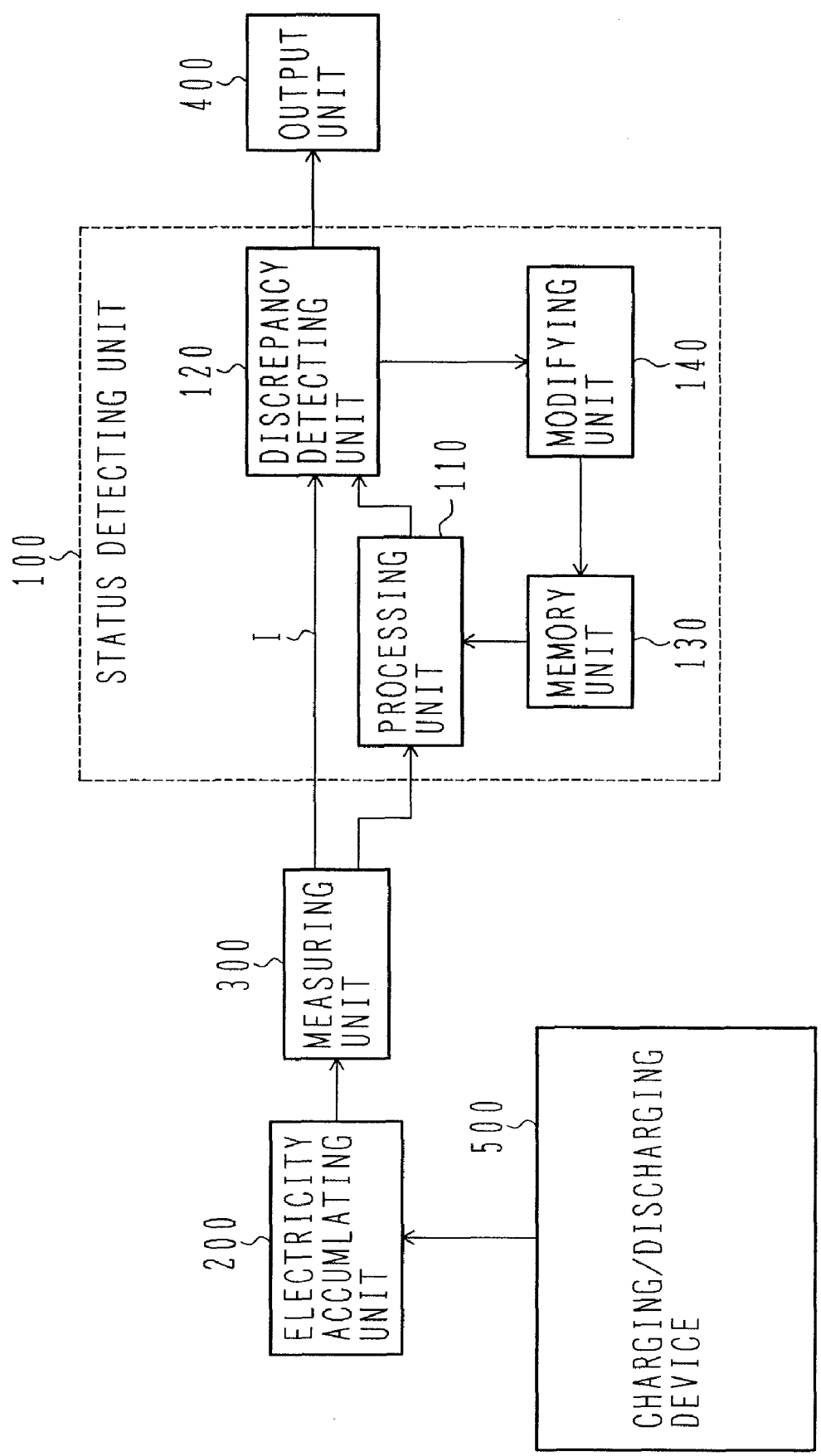
FIG. 13 is a block diagram showing the configuration of an initial characteristic extracting device for use with a power supply according to a fifth embodiment of the present invention.

FIG. 13 is a block diagram showing the configuration of the initial characteristic extracting device for use with the power supply according to the fifth embodiment of the present invention. The same reference numerals as those in FIG. 1 denote the same components.

The initial characteristic extracting device of this embodiment includes, as shown in FIG. 13, a charging/-discharging unit 500 in addition to the power supply shown in FIG. 1.

In the power supply shown in FIG. 1, it is assumed that the characteristic information, such as the internal DC resistance R and the polarization voltage Vp of the electricity accumulating unit 200, is stored in the memory unit 130 of the status detecting unit 100 in advance. The initial characteristic extracting device of this embodiment automatically determines the characteristic information, such as the internal DC resistance R and the polarization voltage Vp, for each electricity accumulating unit. The determined characteristic information is stored in another memory unit.

When the extraction of the initial characteristic is completed, the electricity accumulating unit 200 is assembled into the power supply to operate as the electricity accumulating unit 200 shown in FIG. 1, and the characteristic information stored in the other memory unit is also stored in the memory unit 130 shown in FIG. 1 so that the power supply can be easily initialized.

In this embodiment shown in FIG. 13, initial values of the characteristic information first stored in the memory unit 130 can be given by any optional values, e.g., the characteristic information of another electricity accumulating unit 200, random numbers generated as temporary characteristic information, or all 0.

The charging/discharging unit 500 changes the state of charge (SOC) of the electricity accumulating unit 200 by charging and discharging the electricity accumulating unit 200 in accordance with a predetermined pulse pattern.

Figure 14:
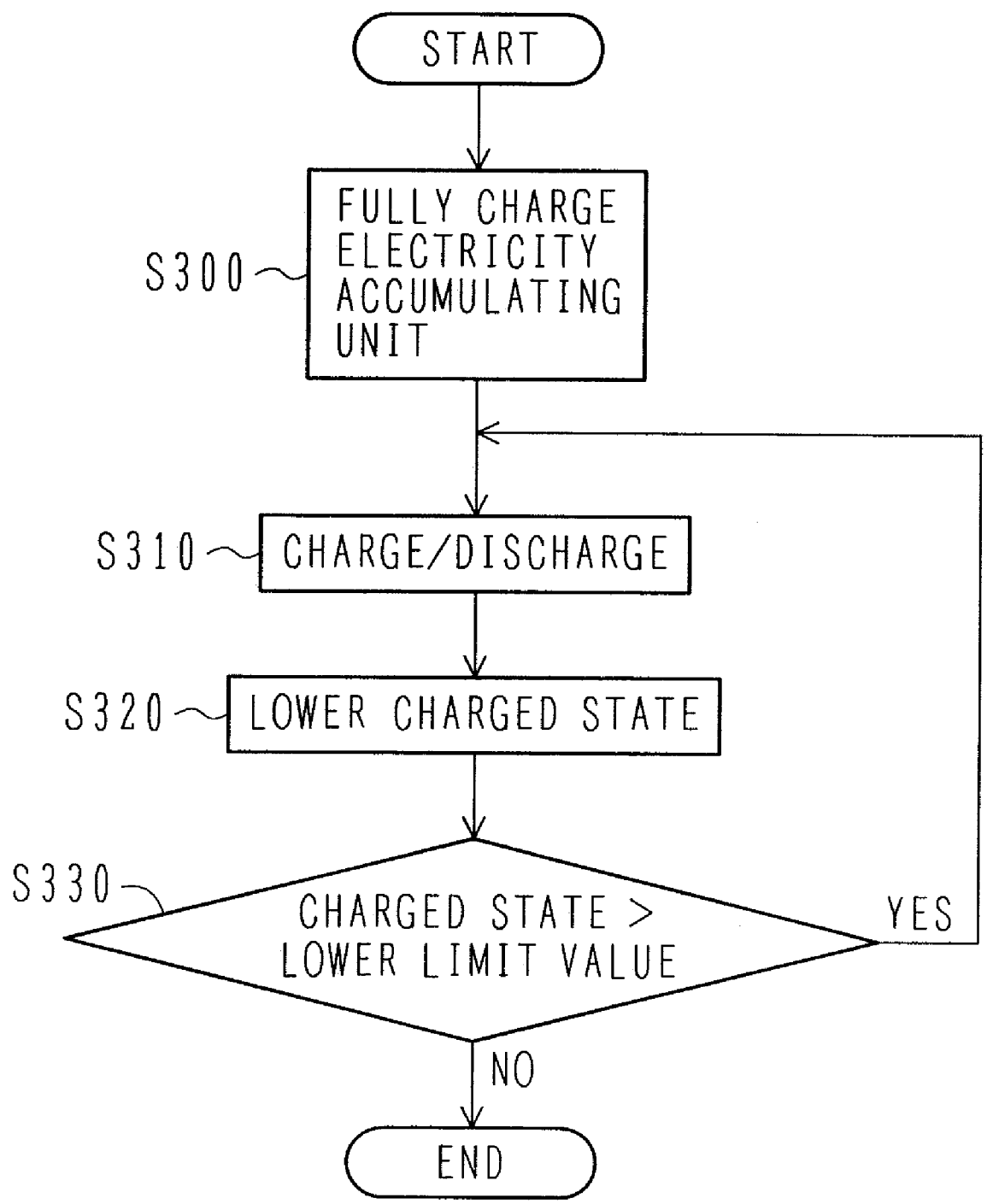
FIG. 14 is a flowchart showing processing procedures executed by a charging/discharging device in the initial characteristic extracting device for use with the power supply according to the fifth embodiment of the present invention.

In step S300 of FIG. 14, the charging/discharging unit 500 first charges the electricity accumulating unit 200 into an almost fully charged state.

Then, in step S310, the charging/discharging unit 500 discharges and charges the electricity accumulating unit 200 in accordance with the predetermined pulse pattern. More specifically, as shown in FIG. 15, the charging/discharging unit 500 discharges the electricity accumulating unit 200 by applying a discharge pulse P11, and subsequently charges the electricity accumulating unit 200 by applying a charge pulse P12.

While the charging/discharging unit 500 discharges and charges the electricity accumulating unit 200, the measuring unit 300 obtains measured values of the electricity accumulating unit 200 during the discharge and the charge, and the processing unit 110 executes the status detection of the electricity accumulating unit 200 based on the measured values and the optionally given characteristic information. Each time the discrepancy detecting unit 120 detects a discrepancy away from the theoretical value, the modifying unit 140 modifies the optionally given characteristic information in a repeated manner so that the characteristic information is finally converged within a certain range.

Figure 15:
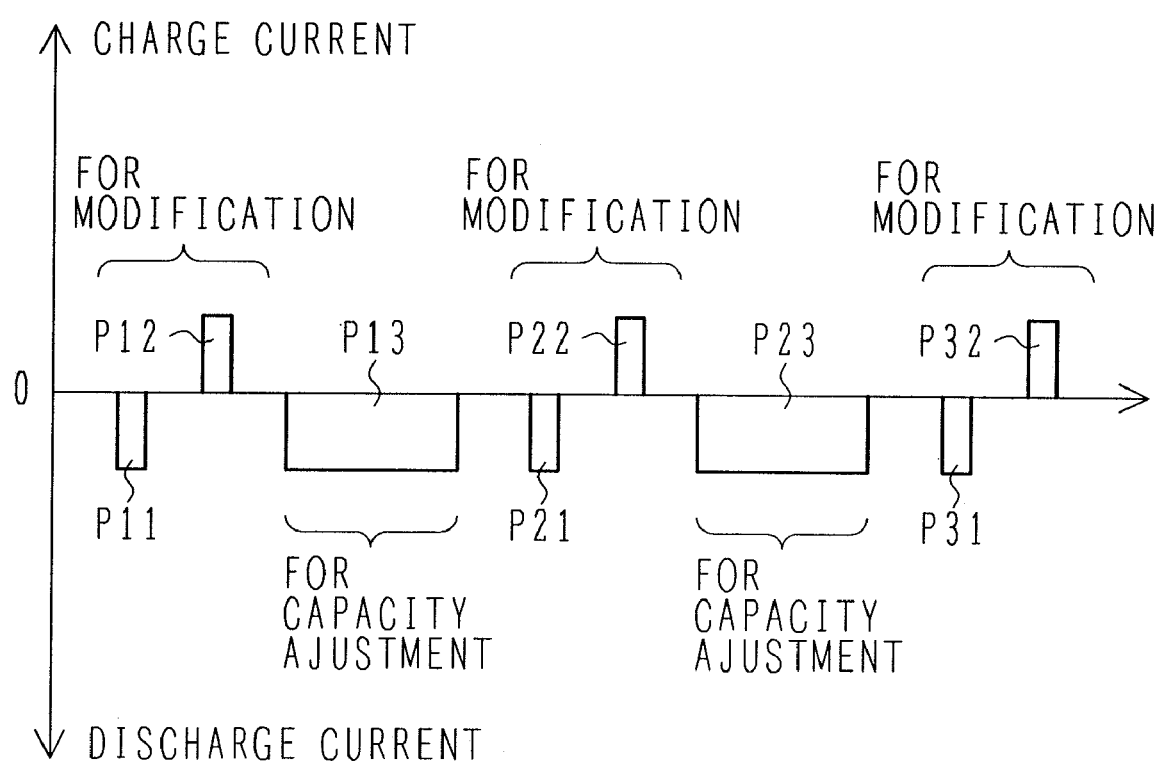
FIG. 15 is a chart for explaining the charging/-discharging device in the initial characteristic extracting device for use with the power supply according to the fifth embodiment of the present invention.

After the lapse of a certain time or after confirmation of the convergence of the characteristic information, the charging/discharging unit 500 discharges the electricity accumulating unit 200 in step S320 by applying a capacity adjustment pulse P13 shown in FIG. 15, thereby lowering the SOC of the electricity accumulating unit 200.

Then, in step S330, it is determined whether the SOC is higher than a predetermined lower limit value, e.g., 0%. If the SOC is higher than the predetermined lower limit value, the processing of steps S310 and S320 is repeated to modify the characteristic information by applying pulses P21 and P22 shown in FIG. 15.

Then, if the SOC after the capacity adjustment has become lower than the predetermined lower limit value (e.g., 0%), the processing is brought to an end.

Instead of the above-described procedures, the process of changing the SOC by the charging/discharging unit 500 may be performed by a method of first setting the SOC of the electricity accumulating unit 200 to 0%, and subsequently repeating charge and discharge for modification and charge for capacity adjustment such that the electricity accumulating unit 200 gradually comes into a fully charged state.

Further, by causing the charging/discharging unit 500 to charge and discharge the electricity accumulating unit 200 while the temperature state of the electricity accumulating unit 200 is changed, it is also possible to modify the characteristic information depending on the temperature state of the electricity accumulating unit 200. In such a case, a thermostatic chamber (not shown), for example, is employed to keep the electricity accumulating unit 200 at a specified temperature. The set temperature of the thermostatic chamber is changed each time the process of discharging and charging the electricity accumulating unit 200 by the charging/discharging unit 500, described above with reference to FIG. 14, is completed. The set temperature of the thermostatic chamber may be changed by a manner of gradually raising the temperature from a low to high level or gradually lowering the temperature from a high to a low level whenever the discharging and charging process shown in FIG. 14 is completed.

According to this embodiment, as described above, the characteristic information can be automatically modified depending on various states, and the initial characteristic of the electricity accumulating unit 200 can be extracted.

The configuration of a second initial characteristic extracting device for use with a power supply according to a sixth embodiment of the present invention will be described below with reference to FIGS. 16 and 17.

Figure 16:
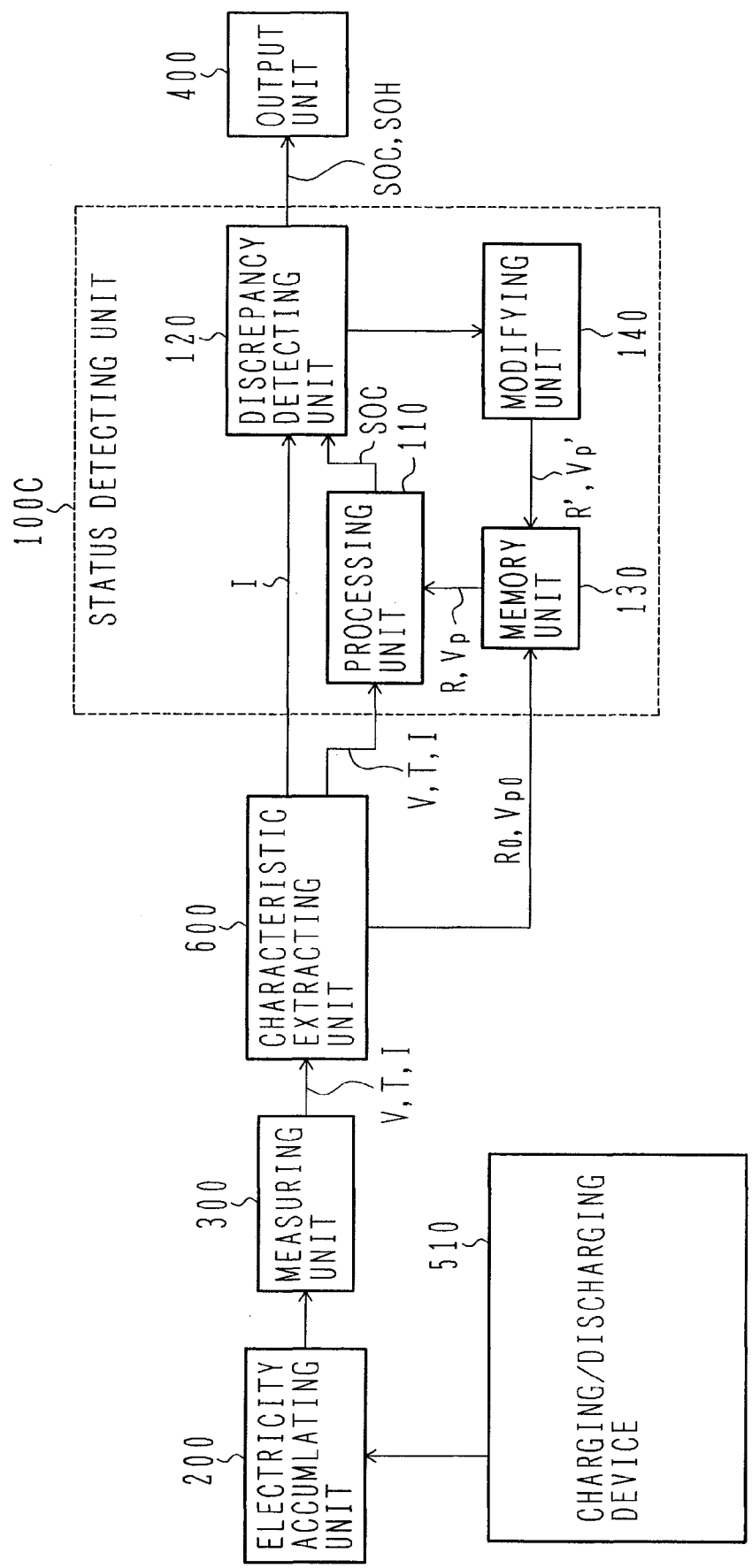
FIG. 16 is a block diagram showing the configuration of a second initial characteristic extracting device for use with a power supply according to a sixth embodiment of the present invention.
Figure 17A:
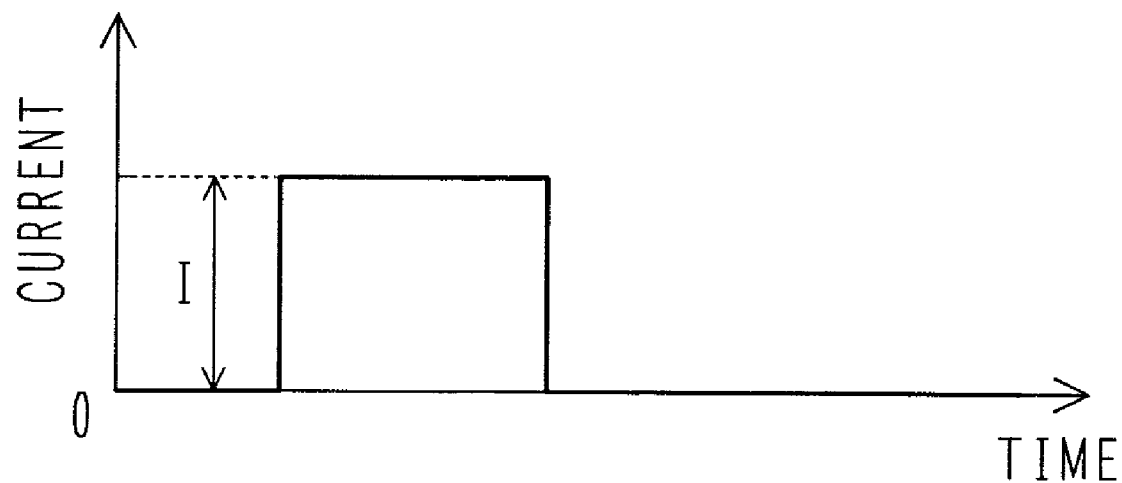
FIGS. 17A and 17B are charts for explaining an initial characteristic extracting method in the power supply according to the sixth embodiment of the present invention.
Figure 17B:
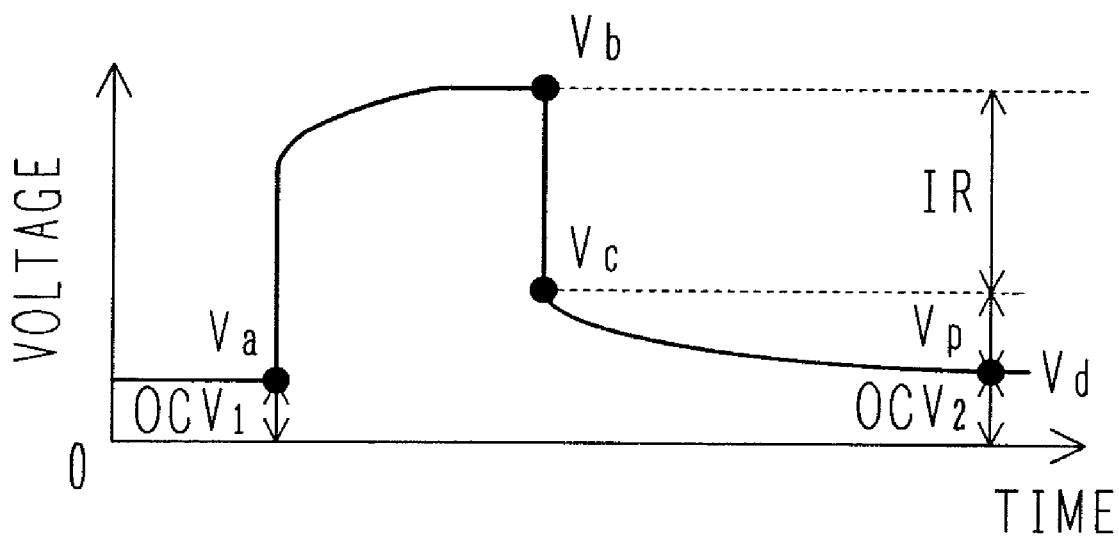

FIG. 16 is a block diagram showing the configuration of the second initial characteristic extracting device for use with the power supply according to the sixth embodiment of the present invention. The same reference numerals as those in FIG. 1 denote the same components. FIGS. 17A and 17B are charts for explaining an initial characteristic extracting method in the power supply according to the sixth embodiment of the present invention.

This embodiment includes a charging/discharging unit 510 instead of the charging/discharging unit 500 shown in FIG. 13. Characteristics of the charging/discharging unit 510 will be described with reference to FIG. 17.

This embodiment further includes a characteristic extracting unit 600. The characteristic extracting unit 600 contains the characteristic information regarding the relationship between the electromotive force (OCV) and the state of charge (SOC), and extracts a characteristic of the electricity accumulating unit 200 by using measured values obtained from the measuring unit 300.

The charging/discharging unit 510 outputs a current signal having a pulse pattern, shown in FIG. 17A, to charge the electricity accumulating unit 200. A voltage measured at this time is changed as shown in FIG. 17B.

The characteristic extracting unit 600 takes in the measured values for a predetermined time while a current I shown in FIG. 17A is applied. The characteristic extracting unit 600 first obtains, from among the taken-in measured values, a voltage Va immediately before the application of the current I. Because the voltage Va represents an electromotive force (OCV1) of the electricity accumulating unit 200, the SOC of the electricity accumulating unit 200 before the application of the current I is determined from the relationship between OCV and SOC, which has been obtained in advance. The voltage Va is taken as a voltage value at the timing before an abrupt increase of the current value, while monitoring the current value among the measured values. Also, the characteristic extracting unit 600 obtains temperature information among the measured values in succession. Thus, the characteristic extracting unit 600 enables the status of the electricity accumulating unit 200, such as the SOC and the temperature, to be automatically detected before the application of the current I.

A description is now made of the operation of the characteristic extracting unit 600 when the electricity accumulating unit 200 is charged with the current I. In general, at the moment when the electricity accumulating unit 200 is charged with the current I, the voltage of the electricity accumulating unit 200 is increased by IR. Upon the end of the charge, a voltage drop IR occurs and thereafter a drop of the polarization voltage Vp occurs. In other words, by using voltages Vb, Vc and Vd shown in FIG. 17B, the internal DC resistance R and the polarization voltage Vp can be calculated respectively from the following formulae (13) and (14):

$$R=(Vb-Vc)/I \quad (13)$$

$$Vp=Vc-Vd \quad (14)$$

Here, because the voltage Vb represents a voltage just before the end of the charge with the current I, it can be readily detected by monitoring the current I. The voltage Vc represents a voltage after the occurrence of the voltage drop IR. The voltage Vc may be decided in an automatic way as a voltage value after a certain time from the end of the charge with the current I. An alternative manner is as follows. Generally, when a voltage change after the end of charge of the electricity accumulating unit 200 exceeds a predetermined threshold, the voltage change represents the voltage drop IR, and when that voltage change does not exceed the predetermined threshold, it represents the polarization voltage drop. Therefore, when the voltage change not exceeding the predetermined threshold is detected as a result of monitoring the voltage value after charging the electricity accumulating unit 200 with the current I, the voltage at that time can be detected as Vc. Also, because the voltage Vd represents a voltage at a time where the voltage change has disappeared after the end of the charge with the current I, it can be readily detected by monitoring an amount of the voltage change. Additionally, the voltage Vd represents an electromotive force (OCV2) of the electricity accumulating unit 200 after the end of the charge with the current I.

From the characteristic information between the electromotive force (OCV) and the state of charge (SOC), the SOC of the electricity accumulating unit 200 after being charged for a predetermined time with the current I can also be readily computed. Further, by using a time from the detection of Vc to the detection of Vd, a delay time (time constant) τ of the polarization voltage drop can be readily computed.

Moreover, by using an amount of charge JI after the charge for the predetermined time with the current I, SOC1 obtained from OCV1 before the charge, and SOC2 obtained from OCV2 after the charge, a fully charged capacity Qmax of the electricity accumulating unit 200 can be readily computed from the following formula (15):

$$Qmax=100\times \int I/(SOC2-SOC1) \quad (15)$$

The internal DC resistance R, the polarization voltage Vp, the time constant τ, and the fully charged capacity Qmax may be determined for one value of the current I, or may be obtained by a manner of determining plural values of each parameter while variously changing the current I and calculating an average of those plural values.

Thus, the characteristic extracting unit 600 can automatically compute not only the present temperature and SOC of the electricity accumulating unit 200, but also the characteristic information, such as the internal DC resistance R, the polarization voltage Vp, the time constant τ, and the fully charged capacity Qmax, corresponding to those present conditions. The computed data of the characteristic information are stored as initial values in the memory unit 130.

Further, by employing the pulse pattern described above with reference to FIGS. 14 and 15, the characteristic information corresponding to various states of charge can be computed. By adjusting the temperature of the electricity accumulating unit 200 using a thermostatic chamber, the characteristic information corresponding to various temperatures and various states of charge of the electricity accumulating unit 200 can also be computed in an automatic manner.

In addition, by applying the above-described manner of computing the characteristic information to the case of discharging the electricity accumulating unit 200 with the current I, the characteristic information corresponding to the temperature and the state of charge of the electricity accumulating unit 200 during discharge can also be computed in an automatic manner.

The characteristic information computed by the characteristic extracting unit 600 is stored in the memory unit 130. On that occasion, the characteristic extracting unit 600 may directly transmit the characteristic information to the memory unit 130 for storage therein, as shown in FIG. 16. Alternatively, the characteristic information may be transmitted to the processing unit 110 such that the processing unit 110 stores the characteristic information in the memory unit 130.

The characteristic extracting unit 600 can be constituted as a microprocessor or a computer executing the above-described processing.

After completing the extraction of the characteristic information as described above, the characteristic extracting unit 600 transmits the received measured values, as they are, to the processing unit 110 or the discrepancy detecting unit 120.

As an alternative, the characteristic extracting unit 600 may be constituted in the form of a program module or a subroutine executing the above-described process. In that case, the characteristic extracting unit 600 is stored in the memory unit 130 as software executing the above-described process, and those procedures are executed by the processing unit 110. When the above-described process of the characteristic extracting unit 600 is completed, the processing unit 110 executes the status detection of the electricity accumulating unit 200 by using the characteristic information that has been prepared by the characteristic extracting unit 600.

After the processing unit 110 executes the status detection of the electricity accumulating unit 200 by using the characteristic information prepared by the characteristic extracting unit 600, the discrepancy detecting unit 120 monitors whether there is a discrepancy away from the theoretical value. Further, the modifying unit 140 modifies the characteristic information by the predetermined modification amount as described above.

Thus, the provision of the characteristic extracting unit 600 enables the initial characteristic information to be automatically determined, the discrepancy detecting unit 120 performs monitoring based on the determined characteristic information, and the modifying unit 140 modifies the characteristic information. Therefore, the initial characteristic can be extracted with high accuracy.

The configuration of a third initial characteristic extracting device for use with a power supply according to a seventh embodiment of the present invention will be described below with reference to FIGS. 18 and 19.

Figure 18:
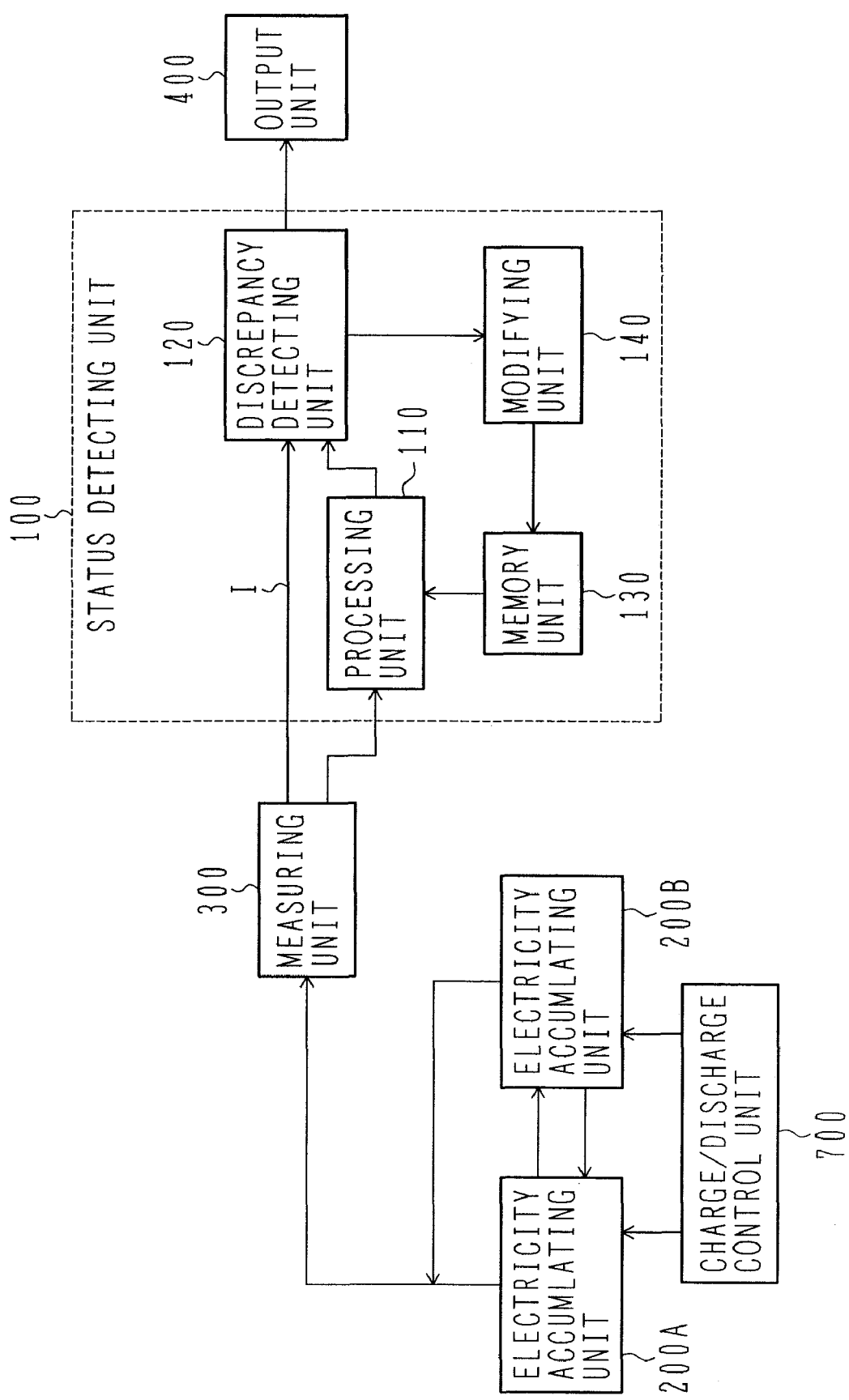
FIG. 18 is a block diagram showing the configuration of a third initial characteristic extracting device for use with a power supply according to a seventh embodiment of the present invention.

FIG. 18 is a block diagram showing the configuration of the third initial characteristic extracting device for use with the power supply according to the seventh embodiment of the present invention. The same reference numerals as those in FIG. 1 denote the same components. FIG. 19 is a chart for explaining an initial characteristic extracting method in the power supply according to the seventh embodiment of the present invention.

This embodiment includes two or more electricity accumulating units 200A and 200B and a charge/discharge control unit 700 for controlling charge and discharge of two or more electricity accumulating units 200A and 200B.

Figure 19:
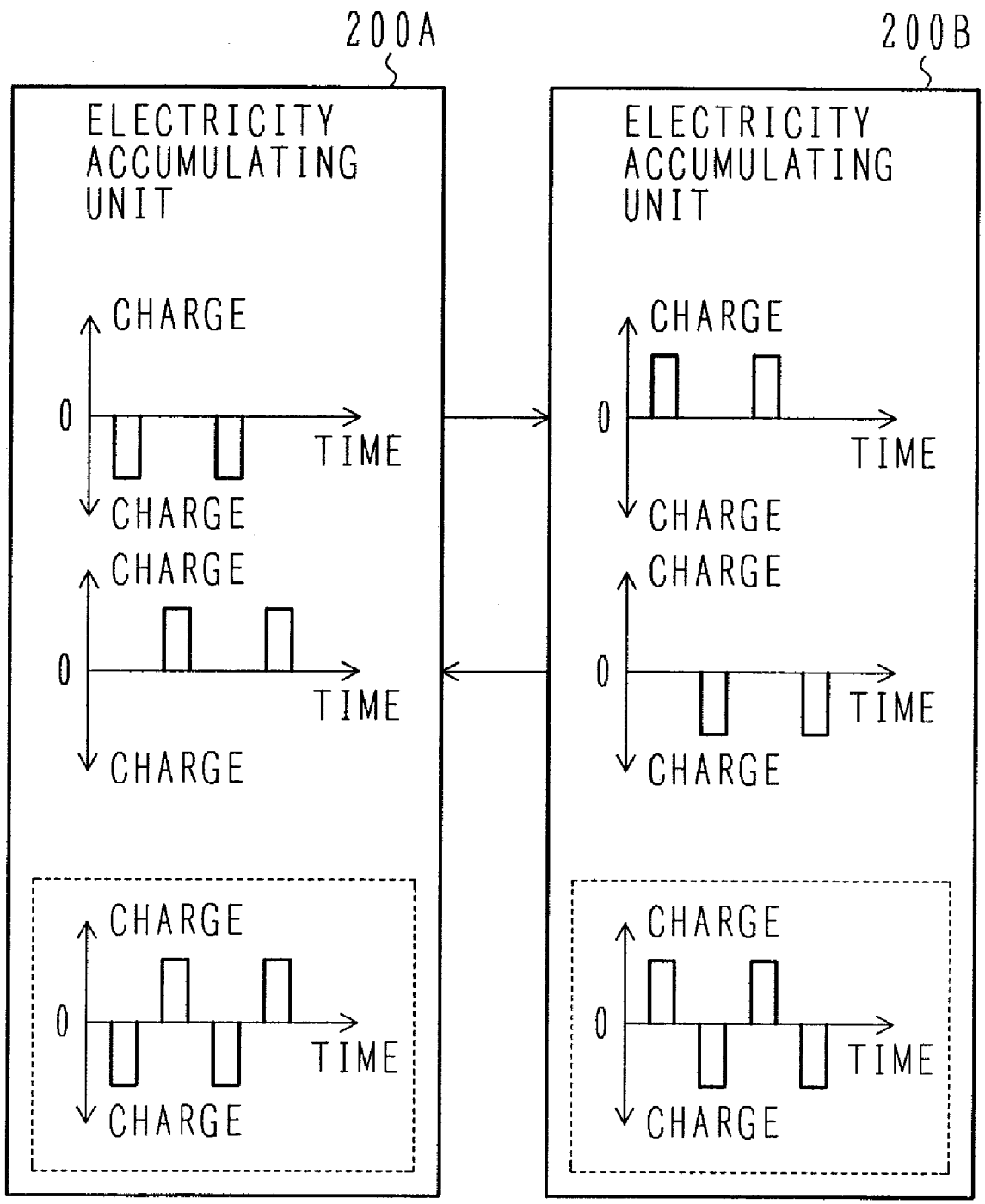
FIG. 19 is a chart for explaining an initial characteristic extracting method in the power supply according to the seventh embodiment of the present invention.

As shown in FIG. 19, the charge/discharge control unit 700 controls charge and discharge of currents between the electricity accumulating units 200A and 200B. More specifically, the charge/discharge control unit 700 discharges the electricity accumulating unit 200A and charges the electricity accumulating unit 200B with the discharge current from the former unit 200A. Also, the charge/discharge control unit 700 discharges the electricity accumulating unit 200B and charges the electricity accumulating unit 200A with the discharge current from the former unit 200B. When the electricity accumulating units 200A and 200B of the same type are charged, the voltage in the discharge side may be boosted using a DC/DC converter, etc. Also, when the voltage in the charge side is lower than that of the electricity accumulating unit in the discharge side, the voltage in the discharge side may be lowered. By repeating the above-mentioned process, charge and discharge can be performed between the two electricity accumulating units 200A and 200B in the same manner as that using a pulse pattern.

In operation, charge and discharge are performed between the electricity accumulating units 200A and 200B, and the measuring unit 300 obtains measured values during the charge and the discharge. The processing unit 110 executes the status detection of each electricity accumulating unit 200 based on the measured values and the optionally given characteristic information. The discrepancy detecting unit 120 monitors whether there is a discrepancy away from the theoretical value, and the modifying unit 140 modifies the optionally given characteristic information. After repeating that process, the finally converged characteristic information is employed as an initial characteristic of the corresponding electricity accumulating unit 200.

The electricity accumulating units 200A and 200B may be of the same type or a combination of different types, such as a lithium ion battery and a lead-acid battery, a lithium ion battery and a nickel-hydrogen battery, or a nickel-hydrogen battery and a lead-acid battery. Further, the two or more electricity accumulating units 200A and 200B may be each of a modular structure including a plurality of electricity accumulating units 200 combined with each other.

While the measuring unit 300 for obtaining the measured values of the electricity accumulating units 200A and 200B is shown only one in FIG. 18, it is actually provided for each of the electricity accumulating units 200A and 200B to obtain the measured values of the corresponding electricity accumulating unit. In other words, when there are two electricity accumulating units 200, two measuring units 300 are provided to obtain respective measured values of the two electricity accumulating units 200 and transmit the measured values to the processing unit 110 or the discrepancy detecting unit 120.

The characteristic information stored in the memory unit 130 may be one kind of data set when the electricity accumulating units 200A and 200B of the same type are provided, or may be different specific kinds of data sets even when the electricity accumulating units 200A and 200B of the same type are provided. Also, the processing procedures stored in the memory unit 130 to execute the status detection are prepared as one kind of procedures when the electricity accumulating units 200A and 200B are the same type. When the electricity accumulating units 200A and 200B are different types, the status detection can also be performed using one kind of processing procedures common to both the units, or may be performed using different kinds of processing procedures dedicated for the respective kinds of the electricity accumulating units 200A and 200B.

The processing unit 110 receives the measured values for each of the electricity accumulating units 200A and 200B, and executes the status detection for each of the electricity accumulating units 200A and 200B by using the characteristic information of the corresponding electricity accumulating unit, which is stored in the memory unit 130. The processing unit 110 may be provided one common to the plurality of electricity accumulating units 200A and 200B, or one dedicated for each of the electricity accumulating units 200A and 200B.

Similarly to the processing unit 110, the discrepancy detecting unit 120 and the modifying unit 140 may be each provided one common to the plurality of electricity accumulating units 200A and 200B, or one dedicated for each of the electricity accumulating units 200A and 200B.

With the above-described configuration, the status detection of the two or more electricity accumulating units 200A and 200B is performed, and when the discrepancy detecting unit 120 detects a discrepancy away from the theoretical value, the modifying unit 140 modifies the characteristic information.

In this way, the initial characteristic of the characteristic information can be obtained by performing charge and discharge between two or more electricity accumulating units.

The configuration of a fourth initial characteristic extracting device for use with a power supply according to an eighth embodiment of the present invention will be described below with reference to FIG. 20.

Figure 20:
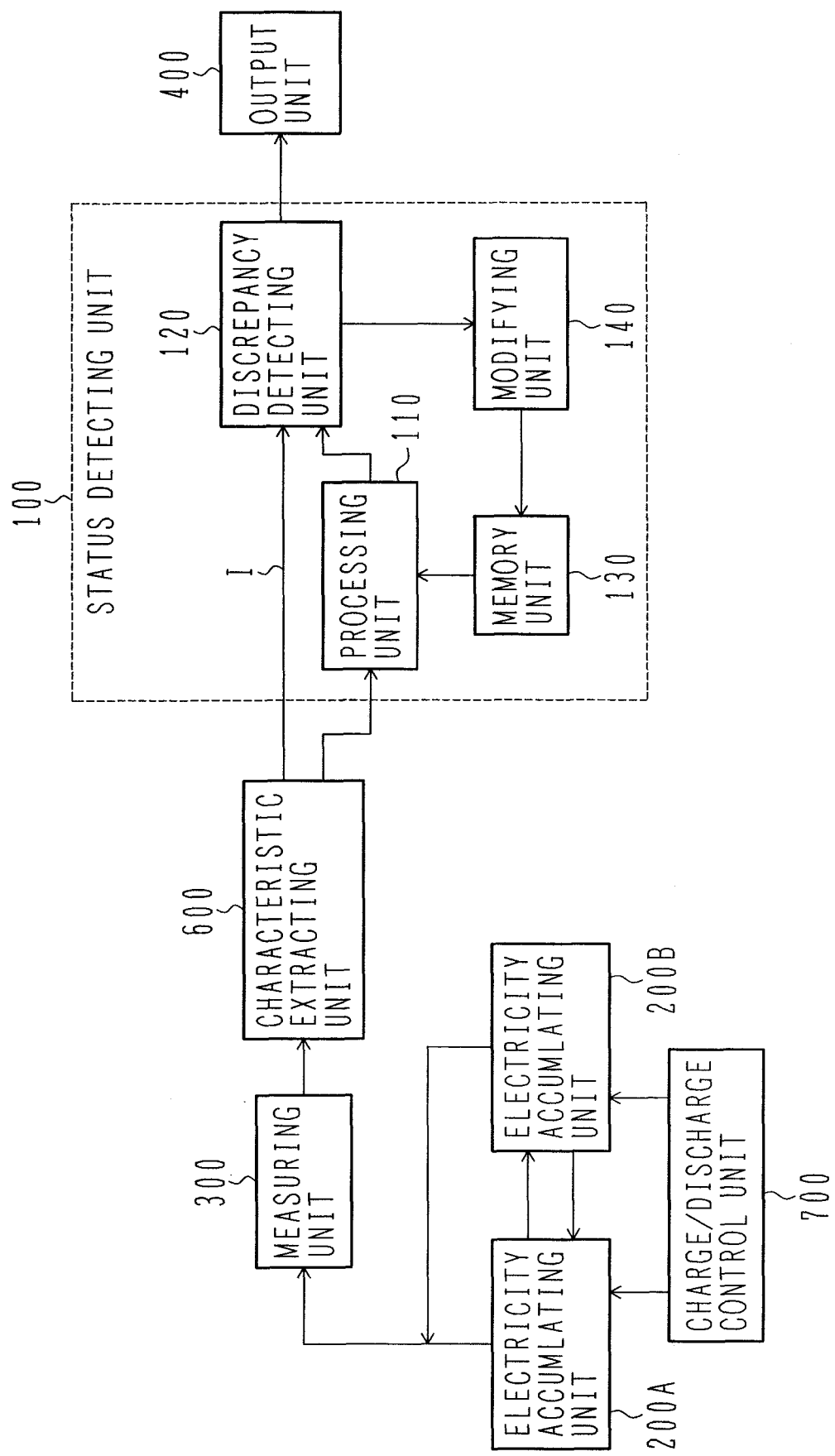
FIG. 20 is a block diagram showing the configuration of a fourth initial characteristic extracting device for use with a power supply according to an eighth embodiment of the present invention.

FIG. 20 is a block diagram showing the configuration of the fourth initial characteristic extracting device for use with the power supply according to the eighth embodiment of the present invention. The same reference numerals as those in FIG. 1 denote the same components.

In this embodiment, the characteristic extracting unit 600 described above with reference to FIG. 16 is additionally associated with the initial characteristic extracting device shown in FIG. 18. More specifically, two or more electricity accumulating units 200A and 200B are provided, and the charge/discharge control unit 700 performs charge and discharge between the electricity accumulating units 200A and 200B. The measuring unit 300 obtains measured values during the charge and the discharge, and the characteristic extracting unit 600 extracts characteristic information based on an analysis using the measured values. The processing unit 110 executes the status detection for each of the electricity accumulating units 200A and 200B based on the extracted characteristic information and the measured values. The discrepancy detecting unit 120 monitors whether there is a discrepancy away from the theoretical value, and the modifying unit 140 modifies the characteristic information.

In this way, the initial characteristic of the characteristic information can be obtained by performing charge and discharge between two or more electricity accumulating units.

According to the present invention, as described above, the state of charge of the electricity accumulating unit can be estimated with high accuracy. Also, the life of the electricity accumulating unit can be quantitatively determined. Further, the initial characteristic of the electricity accumulating unit can be extracted. These advantageous features are applicable to a wide range of fields including mobile equipment, UPS (Uninterruptible Power Supply), and vehicles such as HEV (Hybrid Electric Vehicle) and EV.

What is claimed is:
1. A status detector used for a power supply which provides electricity accumulating means and measuring means for measuring at least current, voltage, and temperature of the electricity accumulating means, comprising:

memory means for storing characteristic information of said electricity accumulating means; and processing means for executing calculation for detecting state of charge of said electricity accumulating means by using information including the measured information obtained from the output of the measuring means and the characteristic information which is stored in said memory means;

wherein said processing means comprises:

a first state of charge detecting means for obtaining a first state of charge of said electricity accumulating means by using information including an open circuit voltage of said electricity accumulating means, and said open circuit voltage is obtained by using information including the measured information and the characteristic information;

a second state of charge detecting means for obtaining a second state of charge of said electricity accumulating means by using information including the current information of said electricity accumulating means obtained from the output of said measuring means;

an error detecting means for obtaining a product of a current of said electricity accumulating means obtained from the output of said measuring means, and an internal DC resistance of said electricity accumulating means;

weight deciding means for obtaining first and second weights which weight to said first state of charge and said second state of charge by using the product of the current and the internal DC resistance obtained by said error detecting means; and means for obtaining the state of charge of said electricity accumulating means by combining a state of charge which is obtained by weighting the first weight to said first state of charge and a state of charge which is obtained by weighting the second weight to said second state of charge.

2. The status detector used for the power supply according to claim 1, wherein the first weight is decreased and the second weight is increased when the current of said electricity accumulating means obtained from the output of said measuring means is increased or the internal DC resistance of said electricity accumulating means is increased, and the first weight is increased and the second weight is decreased when the current of said electricity accumulating means obtained from the output of said measuring means is increased or the internal DC resistance of said electricity accumulating means is decreased.

3. The status detector used for the power supply according to claim 1, further comprising:

discrepancy detecting means for detecting the presence of a discrepancy away from a theoretical value when the state of charge of said electricity accumulating means obtained by said processing means is changed over a predetermined threshold or reversed with respect to the measured information obtained from the output of said measuring means; and modifying means for modifying the characteristic information stored in said memory means depending on the discrepancy detected by said discrepancy detecting means.

4. The status detector used for the power supply according to claim 3, wherein the first weight is decreased and the second weight is increased when the current of said electricity accumulating means obtained from the output of said measuring means is increased or the internal DC resistance of said electricity accumulating means is increased, and the first weight is increased and the second weight is decreased when the current of said electricity accumulating means obtained from the output of said measuring means is decreased the internal DC resistance of said electricity accumulating means is decreased.

5. A power supply comprising:

electricity accumulating means;

measuring means for measuring at least current, voltage, and temperature of said electricity accumulating means; and a status detector for detecting a state of charge of said electricity accumulating means;

wherein said status detector comprises:

memory means for storing characteristic information of said electricity accumulating means; and processing means for executing calculation for detecting state of charge of said electricity accumulating means by using information including the measured information obtained from the output of the measuring means and the characteristic information which is stored in said memory means;

wherein said processing means comprises:

a first state of charge detecting means for obtaining a first state of charge of said electricity accumulating means by using information including an open circuit voltage of said electricity accumulating means, and said open circuit voltage is obtained by using information including the measured information and the characteristic information;

a second state of charge detecting means for obtaining a second state of charge of said electricity accumulating means by using information including the current information of said electricity accumulating means obtained from the output of said measuring means;

an error detecting means for obtaining a product of a current of said electricity accumulating means obtained from the output of said measuring means, and for an internal DC resistance of said electricity accumulating means;

weight deciding means for obtaining first and second weights which weight to said first state of charge and said second state of charge by using the product of the current and the internal DC resistance obtained by said error detecting means; and means for obtaining the state of charge of said electricity accumulating means by combining a state of charge which is obtained by weighting the first weight to said first state of charge and a state of charge which is obtained by weighting the second weight to said second state of charge.

6. The power supply according to claim 5, wherein the first weight is decreased and the second weight is increased when the current of said electricity accumulating means obtained from the output of said measuring means is increased or the internal DC resistance of said electricity accumulating means is increased, and the first weight is increased and the second weight is decreased when the current of said electricity accumulating means obtained from the output of said measuring means is decreased or the internal DC resistance of said electricity accumulating means is decreased.

7. The power supply according to claim 5, further comprising:
- discrepancy detecting means for detecting the presence of a discrepancy away from a theoretical value when the state of charge of said electricity accumulating means obtained by said processing means is changed over a predetermined threshold or reversed with respect to the measured information obtained from the output of said measuring means; and
- modifying means for modifying the characteristic information stored in said memory means depending on the discrepancy detected by said discrepancy detecting means.

8. The power supply according to claim 7,
- wherein the first weight is decreased and the second weight is increased when the current of said electricity accumulating means obtained from the output of said measuring means is increased or the internal DC resistance of said electricity accumulating means is increased, and
- the first weight is increased and the second weight is decreased when the current of said electricity accumulating means obtained from the output of said measuring means is decreased or the internal DC resistance of said electricity accumulating means is decreased.

* * * * *